United States Patent
Wynne

(10) Patent No.: US 12,116,303 B2
(45) Date of Patent: Oct. 15, 2024

(54) METHOD OF BONDING SUBSTRATES AND SEPARATING A PORTION OF THE BONDED SUBSTRATES THROUGH THE BOND, SUCH AS TO MANUFACTURE AN ARRAY OF LIQUID LENSES AND SEPARATE THE ARRAY INTO INDIVIDUAL LIQUID LENSES

(71) Applicant: CORNING INCORPORATED, Corning, NY (US)

(72) Inventor: Thomas Mikio Wynne, Santa Barbara, CA (US)

(73) Assignee: CORNING INCORPORATED, Corning, NY (US)

( * ) Notice: Subject to any disclaimer, the term of this patent is extended or adjusted under 35 U.S.C. 154(b) by 429 days.

(21) Appl. No.: 17/634,158

(22) PCT Filed: Aug. 11, 2020

(86) PCT No.: PCT/US2020/045689
§ 371 (c)(1),
(2) Date: Feb. 9, 2022

(87) PCT Pub. No.: WO2021/030305
PCT Pub. Date: Feb. 18, 2021

(65) Prior Publication Data
US 2022/0289615 A1    Sep. 15, 2022

Related U.S. Application Data

(60) Provisional application No. 62/887,320, filed on Aug. 15, 2019.

(51) Int. Cl.
*C03B 33/02*    (2006.01)
*B81C 3/00*    (2006.01)
(Continued)

(52) U.S. Cl.
CPC .......... *C03B 33/0222* (2013.01); *B81C 3/001* (2013.01); *C03B 23/203* (2013.01);
(Continued)

(58) Field of Classification Search
None
See application file for complete search history.

(56) References Cited

U.S. PATENT DOCUMENTS 5,489,321 A    2/1996 Tracy et al.
6,501,044 B1   12/2002 Klockhaus et al.
(Continued)

FOREIGN PATENT DOCUMENTS

CN    101965242 A    2/2011
CN    106457476 A    2/2017
(Continued)

OTHER PUBLICATIONS

WO 2019131525 machine translation, Nishijima Hirokazu et al. Scribing processing method, Jul. 2019 (Year: 2019).*
(Continued)

*Primary Examiner* — Queenie S Dehghan
(74) *Attorney, Agent, or Firm* — Tamika A. Crawl-Bey

(57) ABSTRACT

A method of forming a bond between substrates and manipulating the bond comprises: emitting a first laser energy onto a strip of an absorption material disposed between a first substrate and a second substrate until the strip diffuses into the first substrate and the second substrate resulting in workpiece with a bond between the first substrate and the second substrate; emitting a second laser energy through the workpiece at the bond to create a fault line through the bond, the first substrate, and the second substrate, the second laser energy provided by an approximated Bessel beam, the approximated Bessel beam incident upon the bond having a diameter that is greater than a width
(Continued)

of the bond; and repeating emitting the second laser energy step along a length of the bond to create a series of fault lines through the bond, the series of fault lines forming a contour.

26 Claims, 26 Drawing Sheets

(51) Int. Cl.
 *C03B 23/203* (2006.01)
 *C03B 33/04* (2006.01)
 *G02B 3/00* (2006.01)
(52) U.S. Cl.
 CPC ............ *C03B 33/04* (2013.01); *G02B 3/0031* (2013.01); *B81C 2203/037* (2013.01)

(56) References Cited

U.S. PATENT DOCUMENTS

| 8,649,102 B2 | 2/2014 | Berge et al. | |
|---|---|---|---|
| 2012/0260694 A1 | 10/2012 | Matsumoto | |
| 2013/0112650 A1* | 5/2013 | Karam | B23K 26/0622 216/13 |
| 2017/0023841 A1* | 1/2017 | N'Gom | G02F 1/1533 |

FOREIGN PATENT DOCUMENTS

| WO | 00/20157 A1 | 4/2000 |
|---|---|---|
| WO | 2013/070791 A1 | 5/2013 |
| WO | 2015/095088 A1 | 6/2015 |
| WO | 2017/055576 A1 | 4/2017 |

OTHER PUBLICATIONS

Haneveld et al., "Laser assisted and hermetic room temperature bonding based on direct bonding technology", Micromachining and Microfabrication Process Technology, Proceedings of SPIE vol. 8973, 2014, 8 pages.

International Search Report and Written Opinion of the International Searching Authority; PCT/US2020/045689; mailed on Dec. 23, 2020; 19 pages; European Patent Office.

Sato et al., "Laser welding of plastics transparent to near-infrared radiation", Photon Processing in Microelectronics and Photonics, Proceedings of SPIE vol. 4637, 2002, pp. 487-495.

Wu et al., "Theoretical analysis of a quasi-Bessel beam for laser ablation", Photonics Research vol. 2, Issue 3, 2014, pp. 82-86.

Chinese Patent Application No. 202080072774.9, Office Action dated Sep. 7, 2023, 4 pages (English Translation only), Chinese Patent Office.

* cited by examiner

METHOD OF BONDING SUBSTRATES AND SEPARATING A PORTION OF THE BONDED SUBSTRATES THROUGH THE BOND, SUCH AS TO MANUFACTURE AN ARRAY OF LIQUID LENSES AND SEPARATE THE ARRAY INTO INDIVIDUAL LIQUID LENSES

CROSS REFERENCE TO RELATED APPLICATIONS

This application claims the benefit of priority under 35 U.S.C. § 371 of International Application No. PCT/US2020/045689, filed on Aug. 11, 2020, which claims the benefit of priority under 35 U.S.C. § 119 of U.S. Provisional Application No. 62/887,320, filed Aug. 15, 2019, the content of each of which is incorporated herein by reference in its entirety.

BACKGROUND

The present disclosure generally relates to the bonding of substrates and separation of a portion of the bonded substrates through the bond, such as to manufacture an array of liquid lenses and separate the array into individual liquid lenses.

A liquid lens incorporates a first liquid and a second liquid that are relatively immiscible with each other and have different indices of refraction for electromagnetic radiation of one or more relevant wavelengths. The first liquid and the second liquid thus form a meniscus (interface) that manipulates incident electromagnetic radiation of the one or more relevant wavelengths, such as to facilitate sensing of the electromagnetic radiation. The shape and position of the meniscus can be altered using principles of electrowetting. Thus the liquid lens can be utilized for autofocus, optical zoom, and optical image stabilization functions, among other things. Two or more layers of substrates surround and encapsulate the first liquid and the second liquid in the liquid lens, preventing those liquids from escaping the liquid lens.

There is a need for methods of manufacturing liquid lenses in a fast, large-scale, manner.

SUMMARY

According to a first aspect of the present disclosure, a method of forming a bond between substrates and manipulating the bond, the method comprises: emitting a first laser energy onto a length and a width of a strip of an absorption material disposed between a first substrate and a second substrate until the strip of the absorption material diffuses into one or more of the first substrate and the second substrate resulting in a bond between the first substrate and the second substrate and, thereby creating a workpiece with the first substrate bonded to the second substrate through the bond, the bond having a length and a width at least approximating the length and the width of the strip before the strip is diffused. The method further includes emitting a second laser energy through the workpiece at the bond to create a fault line through the bond, the first substrate, and the second substrate, the second laser energy provided by an approximated Bessel beam, the approximated Bessel beam incident upon the bond having a diameter that is greater than the width of the bond. The method further includes repeating emitting the second laser energy step along the length of the bond to create a series of fault lines through the bond, the series of fault lines forming a contour.

In embodiments, the method further includes separating a first portion of the workpiece from a second portion of the workpiece along the contour. In embodiments, separating the first portion of the workpiece from the second portion of the workpiece along the contour comprises applying mechanical or thermal stress on or around the contour. In embodiments, each of the first portion and the second portion comprises the first substrate, the second substrate, and a portion of the width of the bond. In embodiments, the first portion comprises one or more edges. In embodiments, at least one of the one or more edges comprises at least a portion of the bond between the first substrate and the second substrate. In embodiments, the bond is contiguous around a perimeter of the first portion.

In embodiments, the method further comprises emitting a third laser energy onto a layer of the absorption material disposed between the first substrate and the second substrate to remove a portion of the absorption material to form the strip of the absorption material. In embodiments, after the strip of the absorption material is formed, a first portion of the layer of the absorption material remains disposed between the first substrate and the second substrate lateral to the strip, and a second portion of the layer of the absorption material remains disposed between the first substrate and the second substrate lateral to the strip. In embodiments, the first portion of the layer of the absorption material and the second portion of the layer of the absorption material are separated by a distance. In embodiments, the first portion of the layer of the absorption material and the second portion of the layer of the absorption material do not interfere with the approximated Bessel beam. In embodiments, the distance is greater than the diameter of the approximated Bessel beam that intersects with an incident plane defined by the first portion and the second portion, such that the first portion and the second portion do not interfere with the second laser energy creating the fault line during the emitting the second laser energy step. In embodiments, the first substrate and the second substrate are glass substrates.

In embodiments, the first laser energy penetrates through either the first substrate or the second substrate before interacting with the strip of the absorption material to cause the absorption material to diffuse, whichever of the first substrate or the second substrate through which the first laser energy penetrates before interacting with the strip of the absorption material is at least essentially transparent to a wavelength of the first laser energy, and the absorption material is essentially opaque to the wavelength of the first laser energy. In embodiments, both the first substrate and the second substrate are at least essentially transparent to the wavelength of the first laser energy. In embodiments, the absorption material comprises a metal, a semiconductor, or a ceramic. In embodiments, the strip of the absorption material has a thickness of at least 1 nm. In embodiments, the first laser energy is provided by a Gaussian laser beam. In embodiments, the width of the strip is between 5 µm and 350 µm. In embodiments, the width of the strip is between 10 µm and 100 µm.

In embodiments, the fault lines in the series of fault lines are separated by a distance of between 0.1 µm and 20 µm. In embodiments, the second laser energy has a wavelength of any of 266 nm, 355 nm, 532 nm, or 1064 nm. In embodiments, the second laser energy is provided in a pulse duration of 100 psec or less. In embodiments, the approximated Bessel beam is generated by emitting the second laser energy in the form of a Gaussian laser beam and then manipulating the Gaussian laser beam with an axicon lens.

In embodiments, the method comprises emitting a third laser energy onto a layer of the absorption material disposed between the first substrate and the second substrate to remove a portion of the absorption material to form the strip of the absorption material. After the strip of the absorption material is formed, a first portion of the layer of the absorption material remains disposed between the first substrate and the second substrate lateral to the strip, and a second portion of the layer of the absorption material remains disposed between the first substrate and the second substrate lateral to the strip. The first portion of the layer of the absorption material and the second portion of the layer of the absorption material are separated by a distance. The approximated Bessel beam has a diameter at an incident surface of the workpiece that is greater than the distance between the first portion of the layer of the absorption material and the second portion of the layer of the absorption material, such that the first portion and the second portion do not interfere with the second laser energy creating the fault line during the emitting the second laser energy step. In embodiments, the workpiece is an array of liquid lenses, and the first portion and the second portion are liquid lenses. In embodiments, the workpiece is an array of micro-electro-mechanical systems, and the first portion and the second portion are micro-electro-mechanical systems. In embodiments, the workpiece is an array of microfluidic devices, and the first portion and the second portion are microfluidic devices.

According to a second aspect of the present disclosure, a method of manufacturing a workpiece, the method comprising: emitting an ablating laser energy onto a conductive coating disposed at a top surface of an intermediate substrate comprising the top surface, a bottom surface, a plurality of through holes providing a plurality of through hole surfaces, and a conductive coating applied to the top surface, the bottom surface, and the plurality of through hole surfaces, wherein the emitting the ablating laser energy is conducted to remove top portions of the conductive coating, thereby forming a top strip of the conductive coating at the top surface laterally adjacent to a top region of the conductive coating that is disposed closer to one of the through holes than the top strip. The method further comprises emitting the ablating laser energy onto the conductive coating disposed at the bottom surface of the intermediate substrate to remove bottom portions of the conductive coating, thereby forming a bottom strip of the conductive coating at the bottom surface laterally adjacent to a bottom region of the conductive coating that is disposed closer to the one of the through holes than the bottom strip, each of the top strip and the bottom strip having a width, the widths of the top strip and the bottom strip overlapping each other, and the top strip and the bottom strip separated from each other by a thickness of the intermediate substrate. The method further comprises positioning a bottom substrate adjacent to the bottom surface of the intermediate substrate such that the bottom substrate covers the plurality of through holes of the intermediate substrate at the bottom surface and the bottom strip is disposed between the intermediate substrate and the bottom substrate. The method further comprises emitting a bonding laser energy onto the bottom strip until the bottom strip diffuses into one or more of the intermediate substrate or the bottom substrate, resulting in a bottom bond between the intermediate substrate and the bottom substrate, the bottom bond having a width at least approximating the width of the bottom strip before the bottom strip is diffused. The method further comprises positioning a top substrate adjacent to the top surface of the intermediate substrate such that the top substrate covers the plurality of through holes of the intermediate substrate at the top surface and the top strip is disposed between the intermediate substrate and the top substrate. The method further comprises emitting a bonding laser energy onto the top strip until the top strip diffuses into one or more of the intermediate substrate and the top substrate, resulting in a top bond between the intermediate substrate and the top substrate, the top bond having a width at least approximating the width of the top strip before the top strip is diffused, the top bond spatially overlapping the bottom bond, the top bond and the bottom bond resulting in an array of workpieces, each of the workpieces comprising one of the plurality of through holes. The method further comprises emitting an induced absorption laser energy through the array of workpieces to create a series of fault lines through the top substrate, the top bond, the intermediate substrate, the bottom bond, and the bottom substrate, the series of fault lines forming a contour between adjacent workpieces of the array of workpieces, the induced absorption laser energy provided by an approximated Bessel beam, the approximated Bessel beam incident upon the top bond having a diameter that is greater than the width of the top bond. The method further comprises separating a workpiece from the array of workpieces along the contour.

In embodiments, the top portions and the bottom portions of the conductive coating, which the ablating laser energy removed, surround each of the through holes. In embodiments, the top strip forms a grid with portions of the top strip intersecting. In embodiments, the top substrate, the bottom substrate, and the intermediate substrate comprise glass compositions. In embodiments, the top substrate and the bottom substrate each have a thickness between 100 µm and 300 µm, and the intermediate substrate has a thickness between 400 µm and 700 µm. In embodiments, the width of the top strip is between 10 µm and 100 µm, and the width of the top strip is wider than the width of the bottom strip. In embodiments, the bonding laser energy is provided by a Gaussian laser beam. In embodiments, the top substrate, intermediate substrate, and the bottom substrate are at least essentially transparent to a wavelength of the bonding laser energy. In embodiments, the top strip and the bottom strip are essentially opaque to the wavelength of the bonding laser energy. In embodiments, the approximated Bessel beam is generated by emitting the induced absorption laser energy in the form of a Gaussian laser beam and then manipulating the Gaussian laser beam with an axicon lens. In embodiments, a width the bottom bond is narrower than a width of the top bond.

In embodiments, after emitting the ablating laser energy onto the conductive coating disposed at the top surface of the intermediate substrate to remove top portions of the conductive coating, thereby forming the top strip of the conductive coating at the top surface, the top strip is disposed between two top regions of conductive coating. The two top regions are separated by a distance and define an incident plane. The distance between the two top regions is larger than the diameter of the approximated Bessel beam that intersects with the incident plane defined by the two top regions. In embodiments, the distance between the two top regions is between 1% and 10% larger than the diameter of the approximated Bessel beam that intersects with the incident plane defined by the two top regions.

In embodiments, after emitting the ablating laser energy onto the conductive coating disposed at the bottom surface of the intermediate substrate to remove bottom portions of the conductive coating, thereby forming the bottom strip of the conductive coating at the bottom surface, the bottom strip is disposed between two bottom regions of the conductive coating. The two bottom regions are separated by a distance and define an incident plane. The distance between the two bottom regions is larger than the diameter of the approximated Bessel beam that intersects with the incident plane defined by the two bottom regions. In embodiments, the distance between the two regions is between 1% and 10% larger than the diameter of the approximated Bessel beam that intersects with the incident plane defined by the two regions. In embodiments, the distance between the two bottom regions is smaller than the distance between the two top regions.

In embodiments, separating a workpiece from the array of workpieces along the contour comprises applying mechanical or thermal stress on or around the contour. In embodiments, separating the workpiece from the array of workpieces along the contour comprises applying a laser energy on or around the contour to create thermal stress to separate the workpiece from the array of workpieces. In embodiments, the workpiece separated from the array of workpieces has a perimeter, and both the top bond and the bottom bond are contiguous around the perimeter. In embodiments, the array of workpieces is an array of liquid lenses. In embodiments, the workpiece is a liquid lens. In embodiments, the array of workpieces is an array of micro-electro-mechanical systems or an array of microfluidic devices.

According to a third aspect of the present disclosure, a liquid lens comprises: a top substrate; a bottom substrate; an intermediate substrate disposed between the top substrate and the bottom substrate, the intermediate substrate comprising a through hole; a top bond bonding the top substrate to the intermediate substrate, the top bond comprising diffused conductive material; a bottom bond bonding the bottom substrate to the intermediate substrate, the bottom bond comprising diffused conductive material; a top region of a conductive coating disposed between the top substrate and the intermediate substrate and at least partially surrounding the through hole, the top region separated from the top bond by a distance; a bottom region of the conductive coating disposed between the intermediate substrate and the bottom substrate and at least partially surrounding the through hole, the bottom region separated from the bottom bond by a distance; and one or more edges forming a perimeter around the liquid lens. The top substrate, the intermediate substrate, the bottom substrate, the top bond, and the bottom bond form the one or more edges. The top bond and the bottom bond are contiguous around the perimeter. In embodiments, the distance separating the bottom region from the bottom bond is smaller than the distance separating the top region from the top bond. In embodiments, the distance separating the top region from the top bond is between 50 µm and 150 µm. In embodiments, the distance separating the bottom region from the bottom bond is between 50 µm and 150 µm.

According to a fourth aspect of the present disclosure, a method of manufacturing a workpiece, the method comprising: forming a top strip of a conductive coating laterally adjacent to a top region of the conductive coating at a top surface of an intermediate substrate, the intermediate substrate comprising the top surface, a bottom surface, a plurality of through holes providing a plurality of through hole surfaces, and the conductive coating, wherein the conductive coating is applied to the top surface, the bottom surface, and the plurality of through hole surfaces, wherein the top region of the conductive coating is disposed closer to one of the through holes than the top strip. The method further comprises forming a bottom strip of the conductive coating at the bottom surface laterally adjacent to a bottom region of the conductive coating that is disposed closer to the one of the through holes than the bottom strip, each of the top strip and the bottom strip having a width, the widths of the top strip and the bottom strip overlapping each other, and the top strip and the bottom strip separated from each other by a thickness of the intermediate substrate. The method further comprises positioning a bottom substrate adjacent to the bottom surface of the intermediate substrate such that the bottom substrate covers the plurality of through holes of the intermediate substrate at the bottom surface and the bottom strip is disposed between the intermediate substrate and the bottom substrate. The method further comprises emitting a bonding laser energy onto the bottom strip until the bottom strip diffuses into one or more of the intermediate substrate or the bottom substrate, resulting in a bottom bond between the intermediate substrate and the bottom substrate, the bottom bond having a width at least approximating the width of the bottom strip before the bottom strip is diffused. The method further comprises positioning a top substrate adjacent to the top surface of the intermediate substrate such that the top substrate covers the plurality of through holes of the intermediate substrate at the top surface and the top strip is disposed between the intermediate substrate and the top substrate. The method further comprises emitting a bonding laser energy onto the top strip until the top strip diffuses into one or more of the intermediate substrate and the top substrate, resulting in a top bond between the intermediate substrate and the top substrate, the top bond having a width at least approximating the width of the top strip before the top strip is diffused, the top bond spatially overlapping the bottom bond, the top bond and the bottom bond resulting in an array of workpieces, each of the workpieces comprising one of the plurality of through holes. The method further comprises emitting an induced absorption laser energy through the array of workpieces to create a series of fault lines through the top substrate, the top bond, the intermediate substrate, the bottom bond, and the bottom substrate, the series of fault lines forming a contour between adjacent workpieces of the array of workpieces, the induced absorption laser energy provided by an approximated Bessel beam, the approximated Bessel beam incident upon the top bond having a diameter that is greater than the width of the top bond. The method further comprises separating a workpiece from the array of workpieces along the contour.

In embodiments, forming the top strip of the conductive coating comprises ablating by laser portions of the conductive coating applied to the top surface. In embodiments, forming the bottom of the conductive coating comprises ablating by laser portions of the conductive coating applied to the bottom surface. In embodiments, forming the top strip of the conductive coating comprises removing portions of the conductive coating applied to the top surface via photoresist based masking. In embodiments, forming the bottom of the conductive coating comprises removing portions of the conductive coating applied to the bottom surface via photoresist based masking. In embodiments, the array of workpieces is an array of liquid lenses. In embodiments, the workpiece is a liquid lens. In embodiments, the array of workpieces is an array of microfluidic devices or an array of micro-electro-mechanical systems.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

DETAILED DESCRIPTION

Figure 1:
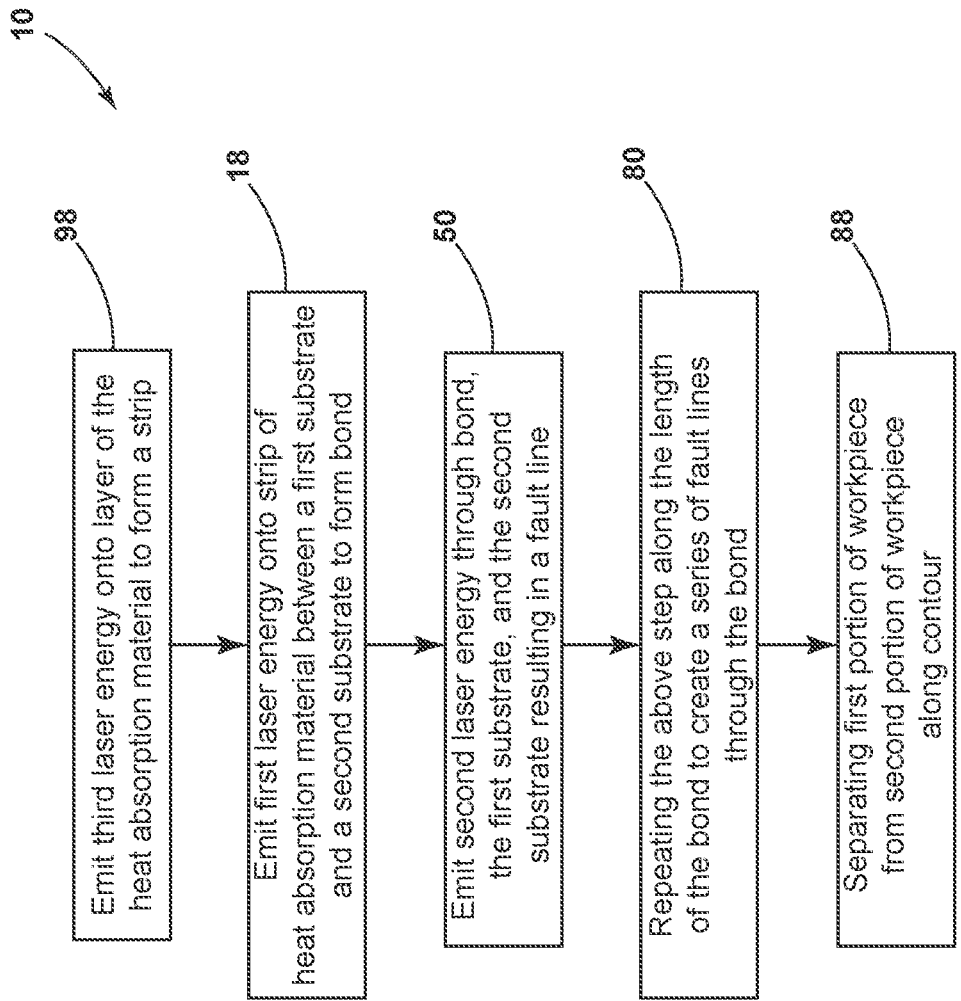
FIG. 1 is a flow chart for a method of forming a bond between a first substrate and a second substrate to form a workpiece and then separate the workpiece into separate portions.

Reference will now be made in detail to the present preferred embodiments, examples of which are illustrated in the accompanying drawings. Whenever possible, the same reference numerals will be used throughout the drawings to refer to the same or like parts.

As mentioned, there is a need for fast and robust methods of manufacturing liquid lenses and other workpieces. The following description satisfies that need by using a laser process to diffuse absorbing material, such as a conductive coating, disposed between layers of substrates and thereby form bonds between the layers of substrates to create an array of liquid lenses, each of the liquid lenses hermetically sealed by the bonds between the substrates. The surface area of the conductive coating disposed between the layers of substrates, at least part of which is diffused by the laser process to form the bonds between the layers of substrates, will typically be maximized in each of the liquid lenses for functional reasons. A subsequent laser process creates a series of fault lines, along a contour, through the bonds that bond the layers of substrates to facilitate the separation of individual liquid lenses from the array. However, the bonds, containing diffused conductive coating, can optically disrupt the laser energy and hinder the creation of the fault lines. To minimize that disruption, an approximated Bessel beam is utilized, which allows the laser energy to refocus between and beneath the bonds within the layers of substrates. However, the approximated Bessel beam has a diameter that is wider than the bond and, if not accounted for, the remaining conductive coating could also interfere with the approximated Bessel beam and prevent the refocusing of the laser energy between and beneath the bonds. Therefore, before the layers of substrates are layered, another laser process is utilized to remove portions of the conductive coating proximate (e.g., on opposing sides of) the sections of conductive coating that will be diffused as described above to form the bonds between the substrates. The removed portions create an optically clear path between the remaining conductive coating (e.g., a strip of conductive coating) and the bonds for the approximated Bessel beam described above to propagate and therefore refocus the laser energy between and beneath the bonds to create adequate fault lines allowing for the separation of the liquid lenses from the array. The segmentation of portions of the conductive coating allows for fast laser bonding and separation processes to be utilized while maximizing the surface area of the conductive coating remaining in the liquid lenses.

Method of Forming a Bond Between Substrates

Referring now to FIGS. 1-4, embodiments of a novel method 10 of forming a bond 12 between a first substrate 14 and a second substrate 16, and manipulating the bond 12, is herein described. At a step 18, the method 10 includes emitting a first laser energy 20 onto a length 22 and a width 24 of a strip 26 of an absorption material disposed between the first substrate 14 and the second substrate 16. The first laser energy 20 is emitted until the strip 26 of the absorption material diffuses into the first substrate 14 and the second substrate 16 resulting in the bond 12 between the first substrate 14 and the second substrate 16. The bond 12 thus creates a workpiece 28 with the first substrate 14 bonded to the second substrate 16 through the bond 12. The bond 12 has a length 30 and a width 32. The length 30 and the width 32 of the bond 12 at least approximates the length 22 and the width 24 of the strip 26 before the strip 26 is caused to diffuse into the first substrate 14 and the second substrate 16.

The first substrate 14 and the second substrate 16 can be the same, similar, or different substrates. As with the embodiment of the method 10 discussed below concerning liquid lenses, the first substrate 14 and the second substrate 16 can both be glass substrates with the bond 12 thus forming a glass-to-glass bond. In other embodiments of the method 10, the first substrate 14 can be glass while the second substrate 16 is plastic or ceramic, allowing for a glass-to-plastic bond or a glass-to-ceramic bond, as the case may be.

A laser 34 emits the first laser energy 20. The first laser energy 20 first encounters an incident surface 36 after exiting the laser 34. In the embodiments illustrated, the first substrate 14 provides the incident surface 36. The first laser energy 20 has a wavelength, and at least one of the first substrate 14 and the second substrate 16, whichever provides the incident surface 36, is essentially transparent to the wavelength of the first laser energy 20. For a substrate to be "essentially transparent," the substrate transmits greater than 50 percent (such as greater than 55 percent, greater than 60 percent, greater than 65 percent, greater than 70 percent, greater than 75 percent, greater than 80 percent, greater than 90 percent, greater than 95 percent, or greater than 99 percent) of incident first laser energy 20 through the substrate at the selected wavelength. In embodiments, the first laser energy 20 can be provided in the form of a Gaussian laser beam profile.

The strip 26 of the absorption material is not essentially transparent to the wavelength of the first laser energy 20. Rather, the strip 26 of absorption material is essentially opaque or blocking to the wavelength of the first laser energy 20. To be "essentially opaque," the absorption material absorbs or reflects (e.g., does not transmit) greater than 50 percent (such as greater than 55 percent, greater than 60 percent, greater than 65 percent, greater than 70 percent, greater than 75 percent, greater than 80 percent, greater than 90 percent, greater than 95 percent, or greater than 99 percent) of incident first laser energy 20. Thus, the strip 26 of absorption material provides a change in the transmissivity from whichever of the first substrate 14 and the second substrate 16 provides the incident surface 36, and results in absorption of the first laser energy 20. In embodiments, after the first laser energy 20 impinges the strip 26 of absorption material, the strip 26 of absorption material continues to absorb the energy from the first laser energy 20 until a plasma is formed and the temperature of the strip 26 of absorption material rises to a diffusion temperature. In addition, as the strip 26 of absorption material rises in temperature from absorbing the first laser energy 20, interface surfaces 38, 40 of the first substrate 14 and the second substrate 16, respectively, above and below the strip 26 also rise in temperature and soften. Assuming that the strip 26 of absorption material has an affinity to diffuse into the first substrate 14 and the second substrate 16, the strip 26 of absorption material diffuses into the first substrate 14 and the second substrate 16. This diffusion of the strip 26 of absorption material into the first substrate 14 and the second substrate 16 creates the bond 12 between the first substrate 14 and the second substrate 16. Upon diffusion of the strip 26 of absorption material, the plasma collapses and the softened areas of the first substrate 14 and the second substrate 16 fuse together to form the bond 12. In other embodiments, the strip 26 of absorption material continues to absorb the energy from the first laser energy 20 and thereby rise in temperature, which causes the interface surfaces 38, 40 of the first substrate 14 and the second substrate 16 to melt and the absorption material diffuses into the melted interface surfaces 38, 40 creating the bond 12. In embodiments, the diffusion temperature of the strip 26 of absorption material is higher than the first transition temperatures of the first substrate 14 and the second substrate 16, in the event that the first substrate 14 and the second substrate 16 are both glass substrates. Portions of the first substrate 14 and the second substrate 16 laterally away from the strip 26 of absorption material do not rise in temperature and remain at room temperature and thus do not form a bond 12.

In embodiments, the bond 12 is at least essentially transparent to the wavelength of the first laser energy 20, but is less transparent to the wavelength of the first laser energy 20 than whichever of the first substrate 14 and the second substrate 16 provides the incident surface 36. In embodiments, whichever of the first substrate 14 and the second substrate 16 that does not provide the incident surface 36 is also essentially transparent to the wavelength of the first laser energy 20. In such embodiments, the first laser energy 20 propagates through whichever of the first substrate 14 and the second substrate 16 provides the incident surface 36 before interacting with the strip 26 of the absorption material, and then heats the strip 26 until the strip 26 diffuses into the first substrate 14 and the second substrate 16. The first laser energy 20 then propagates through the other of the first substrate 14 or the second substrate 16 not providing the incident surface 36, exiting through an opposite surface 48. Thus, whichever of the first substrate 14 or the second substrate 16 through which the first laser energy 20 penetrates before interacting with the strip 26 of the absorption material is at least essentially transparent to the wavelength of the first laser energy 20. In embodiments, both the first substrate 14 and the second substrate 16 are at least essentially transparent to the wavelength of the first laser energy 20. In these embodiments, the creation of the bond 12 with the first laser energy 20 is self-regulating in the sense that after the strip 26 of absorption material diffuses into the first substrate 14 and second substrate 16, the first laser energy 20 propagates through the first substrate 14, the bond 12, and the second substrate 16 without further heating. The first laser energy 20 exits the second substrate 16. The lower the transmittance of the first substrate 14 or the second substrate 16 providing the incident surface 36, the more of the first laser energy 20 that is absorbed. Such absorbed first laser energy 20 can cause cracking and can prevent diffusion of the strip 26 of absorption material (and thus prevention of creation of the bond 12).

The "absorption material" is any material that absorbs the first laser energy 20 sufficiently to diffuse into the first substrate 14 and the second substrate 16. In embodiments, the strip 26 of absorption material comprises a metal, a semiconductor, or a ceramic material. The strip 26 of absorption material can be deposited onto the interface surface 38 of the first substrate 14 and/or the interface surface 40 of the second substrate 16. The interface surfaces 38, 40 face and, in some embodiments, contact each other where the strip 26 is absent.

Figure 2:
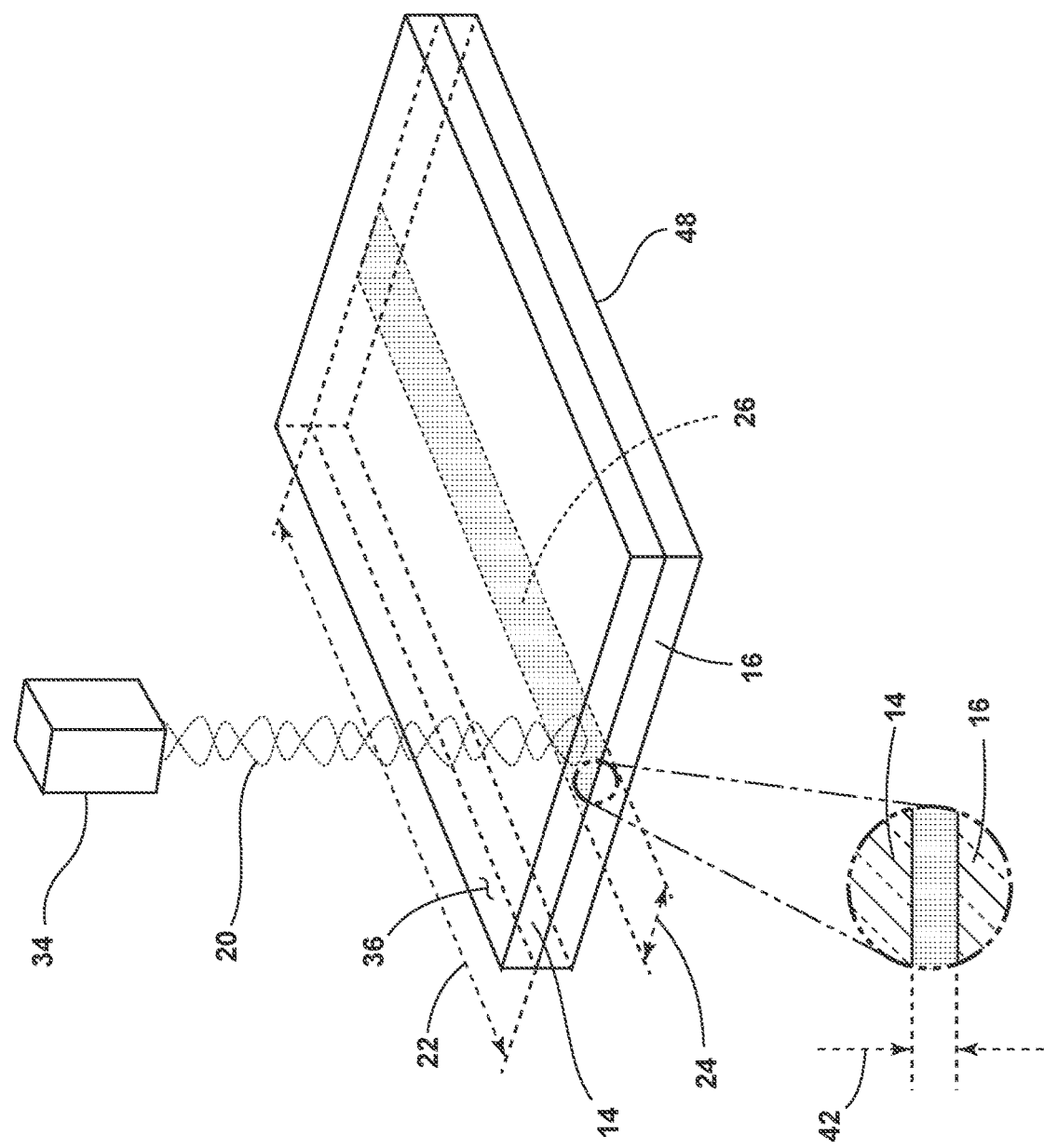
FIG. 2 is a perspective view of a first laser energy being emitted onto a strip of an absorption material disposed between the first substrate and the second substrate, according to a step of the method of FIG. 1, to diffuse the absorption material into the first substrate and the second substrate and form a bond between the first substrate and the second substrate where the strip was.
Figure 3:
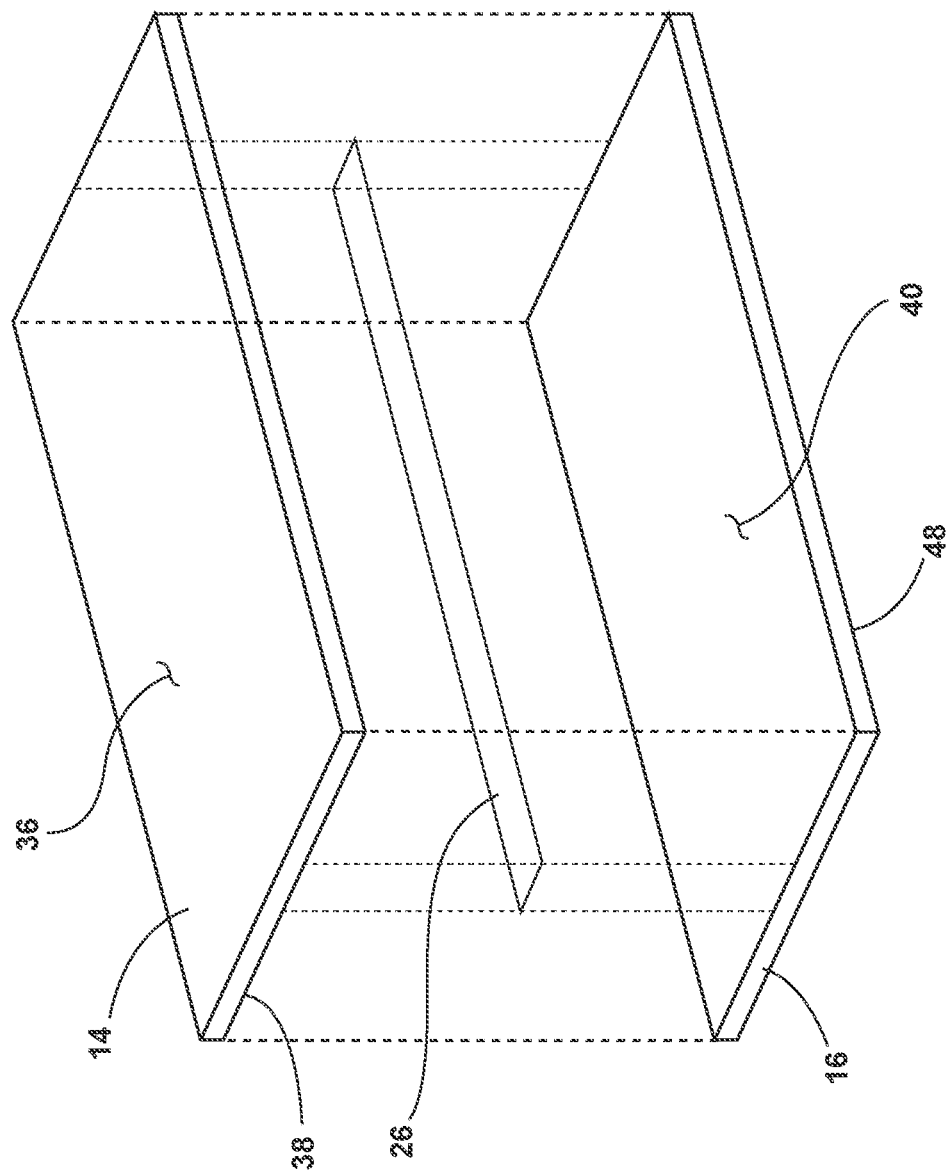
FIG. 3 is an exploded view of FIG. 2, illustrating the strip of absorption material disposed between the first substrate and the second substrate.
Figure 4:
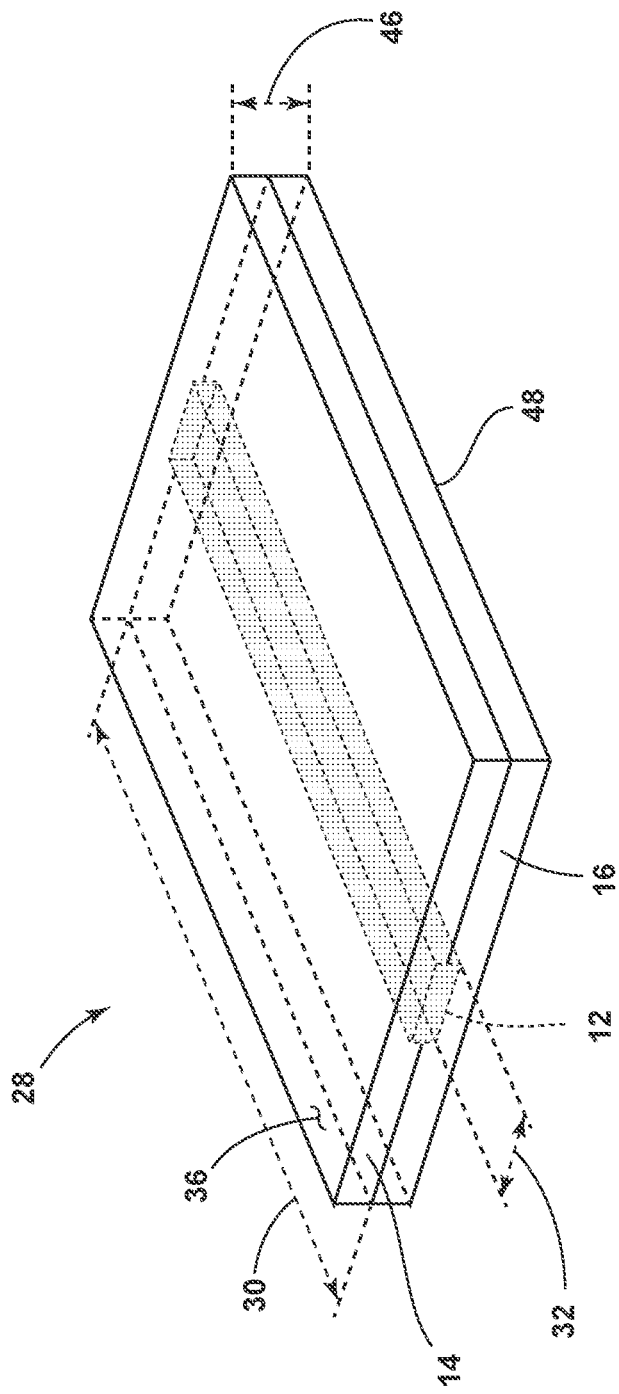
FIG. 4 is a perspective view of a workpiece formed from the bond between the first substrate and the second substrate because of the diffusion of the strip mentioned with FIG. 2 into the first substrate and the second substrate, with the bond having a width illustrated in phantom view.

As in the embodiments illustrated in FIGS. 2-4, the strip 26 of absorption material can be applied to either of the interface surfaces 38, 40 as the strip 26 per se. The width 24 of the strip 26, and thus the width 32 of the resulting bond 12, can vary from approximately 0.001 µm to 350 µm or greater. In embodiments, the widths 24, 32 of the strip 26 and the bond 12 are between 5 µm and 350 µm, such as between 10 µm and 100 µm. The strip 26 of the absorption material has a thickness 42, which, in embodiments, is at least 1 nm. The bond 12 including diffused material from the strip 26 can have a thickness 44 (see FIG. 5) that is thicker than the preceding strip 26, and can vary from a fraction of a micrometer to multiple micrometers. The workpiece 28 resulting from the bond 12 has a thickness 46, defined as the shortest straight-line distance between the incident surface 36 and the opposite surface 48.

The laser 34 emits the first laser energy 20 onto the length 22 of the strip 26 either by moving the strip 26 (together with the first substrate 14 and the second substrate 16 between which the strip 26 is disposed) while the laser 34 remains stationary, or moving the first laser energy 20 along the length 22 of the strip 26 while the strip 26 (together with the first substrate 14 and the second substrate 16 between which the strip 26 is disposed) remains stationary. For example, a motion platform (not illustrated) providing x-axis, y-axis, and optionally z-axis control of the strip 26 together with the first substrate 14 and the second substrate 16 between which the strip 26 is disposed while supporting the laser 34 and any alignment optics fixed in position would be satisfactory for step 18. Alternative embodiments may employ a stationary hold fixture for the strip 26 together with the first substrate 14 and the second substrate 16, but translating motion of the laser 34 or the first laser energy 20 through optical means such as a scanner using an f-theta lens. More details related to step 18 of the method 10 is set forth in U.S. Pat. No. 9,492,990 B2, which is hereby incorporated by reference in its entirety.

Figure 5:
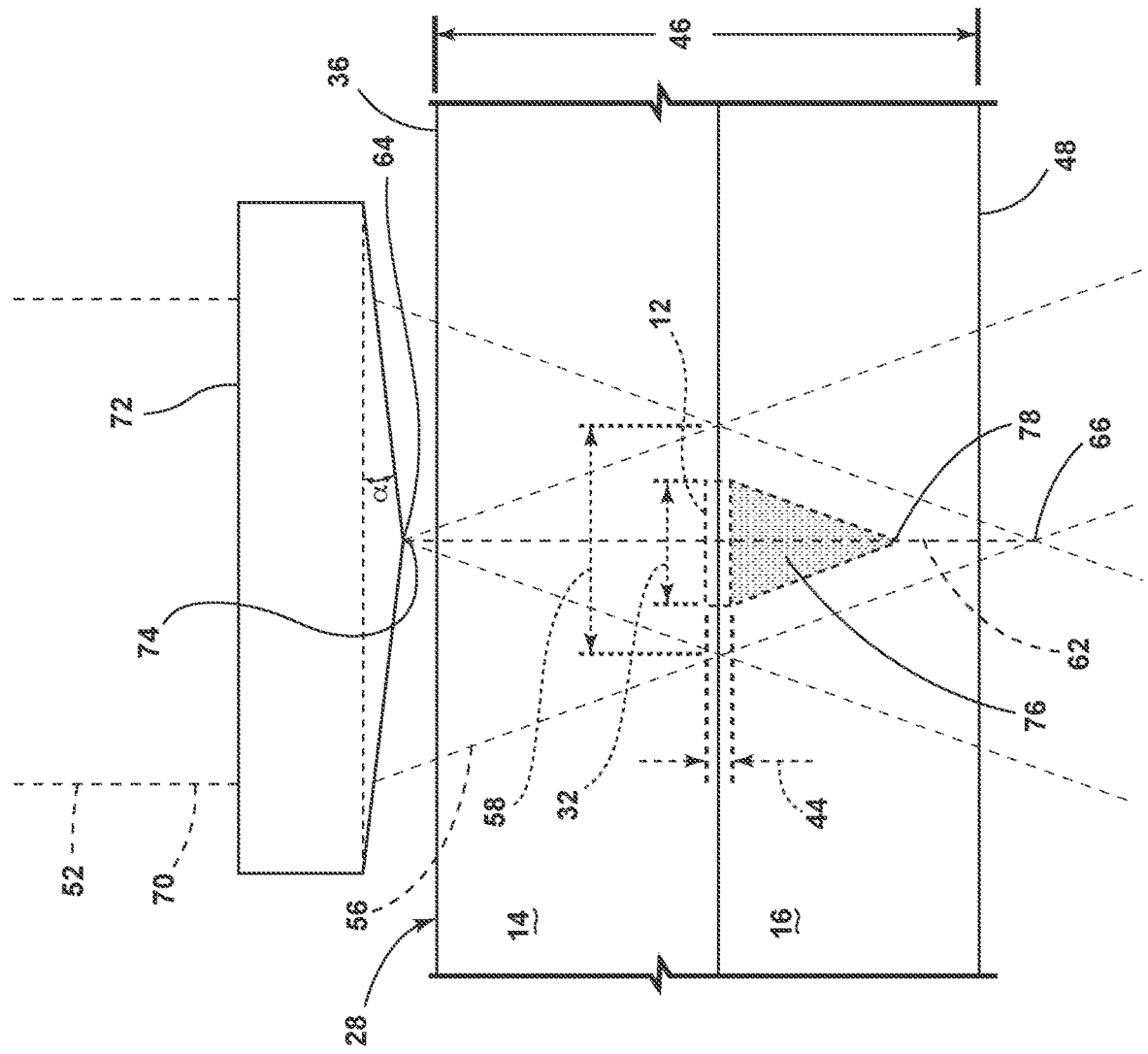
FIG. 5 is a cross-sectional view of a second laser energy generating a focal line of high energy intensity extending through a thickness of the workpiece of FIG. 4 vertically through the bond, according to another step of the method of FIG. 1, illustrating the bond interfering with the focal line within a disruption zone extending from the bond to a refocusing point.

Creation of Fault Lines Through the First Substrate, the Bond, and the Second Substrate Referring now to FIGS. 1 and 5, at a step 50, the method 10 further comprises emitting a second laser energy 52 through the workpiece 28 at the bond 12, resulting in a fault line 54 through the bond 12, the first substrate 14, and the second substrate 16. The second laser energy 52 interacting with the workpiece 28 has an approximated Bessel beam 56 profile. The approximated Bessel beam 56 incident upon the bond 12 has a diameter 58 that is greater than the width 32 of the bond 12.

A laser 60 generates the second laser energy 52 having a certain wavelength. The wavelength of the second laser energy 52 is chosen such that the first substrate 14 and the second substrate 16 are at least essentially transparent to the wavelength of the second laser energy 52. Example wavelengths include 266 nm, 355 nm, 532 nm, and 1064 nm.

In embodiments, the second laser energy 52 is provided in an ultra-short pulse of 100 psec or less. In some embodiments, the pulse duration of the individual pulses is in a range of between greater than about 1 picoseconds and less than about 100 picoseconds, such as greater than about 5 picoseconds and less than about 20 picoseconds, and the repetition rate of the individual pulses is in a range of between about 1 kHz and 4 MHz, such as in a range of between about 10 kHz and 650 kHz.

In embodiments, in addition to a single pulse operation at the aforementioned individual pulse repetition rates, the pulses are produced in bursts of two pulses, or more (such as, for example, 3 pulses, 4, pulses, 5 pulses, 10 pulses, 15 pulses, 20 pulses, or more) separated by a duration between the individual pulses within the burst that is in a range of between about 1 nsec and about 50 nsec, for example, 10 to 30 nsec, such as about 20 nsec, and the burst repetition frequency is in a range of between about 1 kHz and about 200 kHz. Bursting or producing pulse bursts is a type of laser operation where the emission of pulses is not in a uniform and steady stream but rather in tight clusters of pulses. In embodiments, the average laser power per burst measured at the workpiece 28 is greater than 40 microJoules per mm thickness of the workpiece 28, for example, between 40 microJoules/mm and 2500 microJoules/mm, or between 500 and 2250 microJoules/mm.

The approximated Bessel beam 56 profile condenses the second laser energy 52 into a high aspect ratio focal line 62 that penetrates through the thickness 46 of the workpiece 28. The focal line 62 is a high energy density region of cylindrical shape, with a length defined as the distance between a convergence point 64 and a divergence point 66, and a diameter centered around dotted line in FIG. 5. The incident surface 36 of the workpiece 28 is aligned perpendicular to the focal line 62. The focal line 62 overlaps the thickness 46 of the workpiece 28. In other words, the thickness 46 of the workpiece 28 lies between the convergence point 64 and the divergence point 66. In embodiments, the convergence point 64 is above the incident surface 36 of the workpiece 28 and the divergence point 66 is below the opposite surface 48 of the workpiece 28.

The focal line 62 has a high aspect ratio in the sense that the length is larger than the diameter. Because of the high aspect ratio of the focal line 62, the second laser energy 52 creates the fault line 54 that extends through the incident surface 36, through the thickness 46, and through the opposite surface 48 of the workpiece 28. Within the volume of high energy density of the focal line 62, the first substrate 14, the bond 12, and the second substrate 16 are modified to create the fault line 54 via nonlinear effects. Although the first substrate 14 and the second substrate 16 are essentially transparent to the wavelength of the second laser energy 52, the high energy density within the focal line 62 causes multi-photon absorption (MPA) in those substrates. MPA is the simultaneous absorption of two or more photons of identical or different frequencies to excite a molecule from one state (usually the ground state) to a higher energy electronic state (ionization). The energy difference between the involved lower and upper states of the molecule is equal to the sum of the energies of the two photons. MPA, also called induced absorption, can be a second-order or third-order process (or higher order), for example, that is several orders of magnitude weaker than linear absorption. It differs from linear absorption in that the strength of second-order induced absorption can be proportional to the square of the light intensity, for example, and thus it is a nonlinear optical process. It is important to note that without this high optical intensity, nonlinear absorption is not triggered. Below this intensity threshold, the first substrate 14 and the second substrate 16 are essentially transparent to the second laser energy 52 and remain in their original state. In principle, the fault line 54 can be created by a single pulse and if necessary, additional pulses can be used to increase the extension of the affected area (depth and width).

In embodiments, the length of the focal line 62 is in a range of between about 0.1 mm and about 10 mm, or between about 0.5 mm and about 5 mm, such as about 1 mm, about 2 mm, about 3 mm, about 4 mm, about 5 mm, about 6 mm, about 7 mm, about 8 mm, or about 9 mm, or in a range of between about 0.1 mm and about 1 mm. In embodiments, the focal line 62 has an average spot diameter in a range of between about 0.1 micron and about 5 microns.

The fault line 54 is vertically oriented, that is, extending through the workpiece 28 at least approximately orthogonal to the incident surface 36. The fault line 54 has an opening 68 at the incident surface 36, which in embodiments is approximately 1 micron in diameter. The fault line 54 has an internal diameter (within the thickness 46 of the workpiece 28). For example, in some embodiments described herein, the internal diameter of the fault line 54 is less than 500 nm, such as less than 400 nm, and less than 300 nm. In other embodiments, the internal diameter of the fault line 54 is greater than 100 nm.

In embodiments, to provide the approximated Bessel beam 56 profile that forms the high aspect ratio focal line 62, the laser 60 emits the second laser energy 52 with a Gaussian laser beam 70 and an axicon lens 72 manipulates the Gaussian laser beam 70 profile into an approximated Bessel beam 56 profile. For example, the axicon lens 72 is a conically cut lens having an apex 74 directed to the incident surface 36 and an angle α (for example, 10°).

There are other ways to cause the second laser energy 52 to emit, or to manipulate the second laser energy 52 into a profile that forms the high aspect ratio focal line 62, such as with an Airy lens, donut-shaped emissions, spherical lenses, and diffractive elements. The pulse duration (picosecond, femtosecond, etc.) and wavelength (IR, green, UV, etc.) of the second laser energy 52 can also be varied, as long as sufficient optical intensities are reached to create the fault line 54 through the workpiece 28 via nonlinear absorption.

Preferably, the laser 60 producing the second laser energy 52 is a pulse burst laser which allows for control of the energy deposition with time by adjusting the number of pulses within a given burst.

The approximated Bessel beam 56 profile diffracts much more slowly (e.g., may maintain single micron spot sizes for ranges of hundreds of microns or millimeters as opposed to a few tens of microns or less) than the Gaussian beam 70 profile. Hence, the length of high energy intensity from the convergence point 64 to the divergence point 66 that exceeds the thickness 46 of the workpiece 28 is possible with the approximated Bessel beam 56 profile but not typically with the Gaussian beam 70 profile. In instances where the focal line 62 from the convergence point 64 to the divergence point 66 is too long for the thickness 46 of the workpiece 28, other lenses (such as a focusing lens that focuses the Gaussian beam 70 profile leaving the axicon lens 72, or a combination of a collimating lens and a focusing lens) can manipulate the Gaussian beam 70 profile leaving the axicon lens 72 to have a shorter focal line 62 (from the convergence point 64 to the divergence point 66) more suitable to the thickness 46 of the workpiece 28.

Due to the high energy density within the focal line 62, nonlinear interaction of the electromagnetic field of the second laser energy 52 with the workpiece 28 is transferred to the first substrate 14, the bond 12, and the second substrate 16 to effect formation of the fault line 54. However, it is important to realize that in the areas of the workpiece 28 where the laser energy density is not high (e.g., volumes of the workpiece 28 lateral to the focal line 62), the workpiece 28 is essentially transparent to the second laser energy 52 and there is no mechanism for transferring the second laser energy 52 to the workpiece 28. As a result, nothing happens to the workpiece 28 when the intensity of the second laser energy 52 is below the nonlinear threshold.

As mentioned above, the intensity of the second laser energy 52 away from the focal line 62 is insufficiently intense to cause multiphoton absorption and thus fails to create additional defects in the workpiece 28. Similarly, the bond 12, being less transparent to the second laser energy 52 than the first substrate 14 and the second substrate 16, disrupts the second laser energy 52 in a disruption zone 76 that extends from the bond 12 toward the opposite surface 48, in the general direction of propagation of the second laser energy 52. For example, the bond 12 is not essentially transparent and/or essentially opaque to the second laser energy 52. Within this disruption zone 76, the focal line 62 is distorted and is less intense. In other words, the bond 12 creates an optical distortion to the second laser energy 52, which degrades the quality of the focal line 62. If the disruption zone 76 is not accounted for, then the fault line 54 created may not extend entirely through the thickness 46 of the workpiece 28. For example, the fault line 54 might extend only from the incident surface 36 through the first substrate 14 to the bond 12, and such a fault line 54 (as not extending through the bond 12 or the second substrate 16) would hinder subsequent fracture and separation of portions of the workpiece 28 as discussed below.

The approximated Bessel beam 56 profile having the diameter 58 (not to be confused with the diameter of the focal line 62) that is greater (wider) than the width 32 of the bond 12 minimizes the size and adverse effect of the disruption zone 76 that the bond 12 causes. Because the diameter 58 of the approximated Bessel beam 56 incident upon the bond 12 is wider than the width 32 of the bond 12, the approximated Bessel beam 56 is able to fully refocus into the non-disrupted focal line 62 between the end of the disruption zone 76 at a refocusing point 78 and the divergence point 66. That is because the approximated Bessel beam 56 does not produce a single focal point but rather a series of focal points for different rays of the Bessel beam 56 along the focal line 62. Refocusing of the focal line 62 between the refocusing point 78 and the divergence point 66 includes a portion of the thickness of the second substrate 16 that is from the refocusing point 78 to the opposite surface 48. In all, then, the approximated Bessel beam 56 is fully focused into the focal line 62 from the convergence point 64, through the thickness of the first substrate 14 to the bond 12, and from the refocusing point 78 through a portion of the thickness of the second substrate 16 to the opposite surface 48. The larger the diameter 58 approximated Bessel beam 56 profile incident upon the bond 12 relative to the width 32 of the bond 12, the greater the thickness of the second substrate 16 from the refocusing point 78 to the opposite surface 48 that overlaps with the refocused, non-disrupted, focal line 62. The greater the thickness of the second substrate 16 from the refocusing point 78 to the opposite surface 48 that overlaps with the refocused, non-disrupted, focal line 62 from the refocusing point 78 to the divergence point 66, the greater the quality of the fault line 54 through the workpiece 28, including through the bond 12 and the disruption zone 76, that the second laser energy 52 creates.

Creating a Series of Fault Lines

Figure 6:
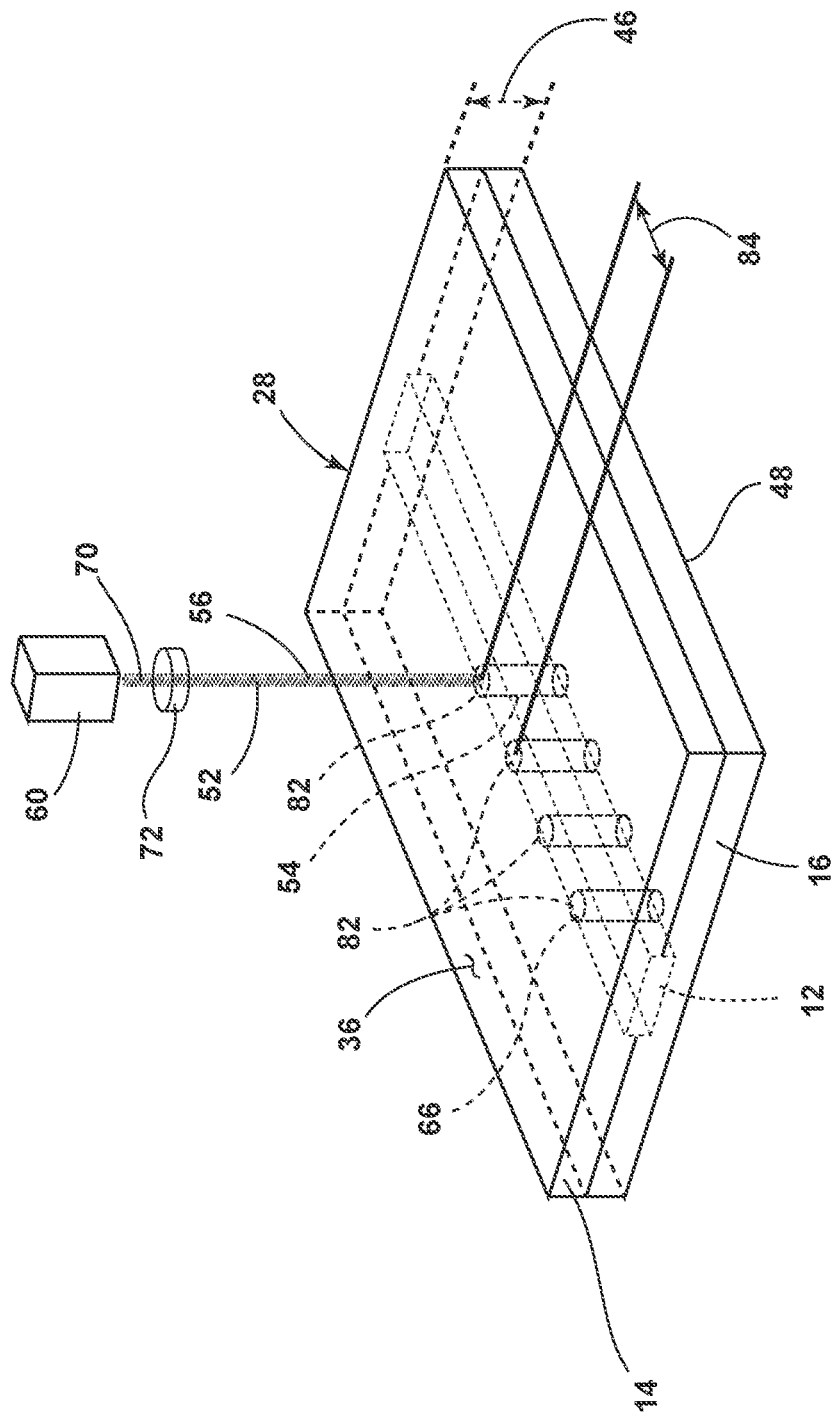
FIG. 6 is a perspective view of a series of fault lines that the focal line of the second laser energy of FIG. 7 generates through the workpiece, illustrating the fault lines extending vertically through the first substrate, the bond, and the second substrate.
Figure 7:
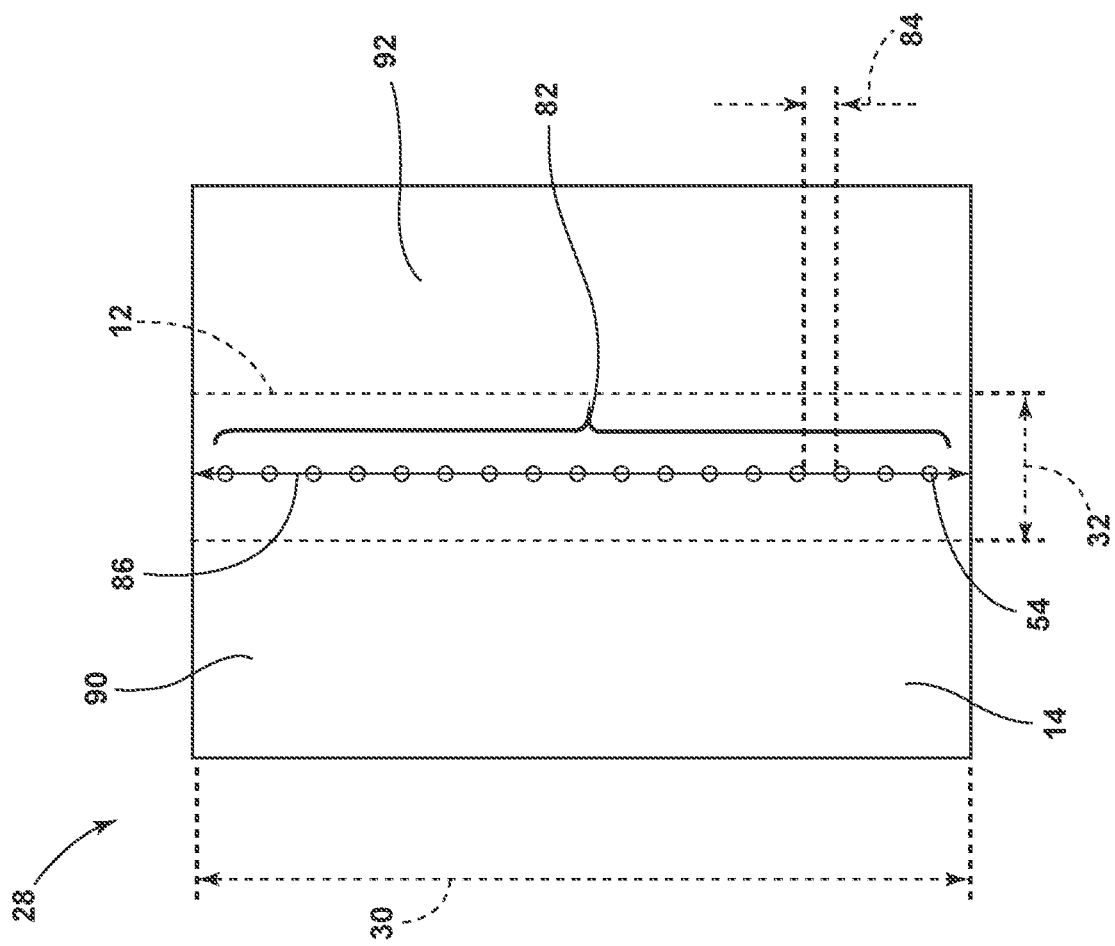
FIG. 7 is an overhead view of the workpiece of FIG. 4 after the second laser energy sequentially generated focal lines along a length of the bond causing the series of fault lines, according to another step of the method of FIG. 1, illustrating the series of fault lines forming a contour along the workpiece tracking the length of the bond between the first substrate and the second substrate.

Referring now additionally to FIGS. 6 and 7, in a step 80, the method 10 further comprises repeating the step 50 along the length 30 of the bond 12 to create a series 82 of fault lines 54 through the thickness 46 of the workpiece 28, including through the bond 12. In general, the series 82 of fault lines 54 facilitate the formation of cracks through the thickness 46 of the workpiece 28 between the fault line 54, and the cracks facilitate the division of the workpiece 28 along the bond 12 into separate pieces. The fault lines 54 in the series 82 are generally spaced at a distance 84 of 0.1 μm to 20 μm, such as 1 μm to 15 μm, such as 3 μm to 12 μm, such as 5 μm to 10 μm. In other embodiments, the distance 84 is 0.5 μm to 15 μm, or 3 μm to 10 μm, or 0.5 μm to 3.0 μm, or 0.5 μm to 1.0 μm. A suitable distance 84 between adjacent fault lines 54 is determined by the properties of the first and second substrates 14, 16 of the workpiece 28 such as the internal tension that facilitates crack propagation between fault lines 54. The fault lines 54 delineate the desired shape and establish a path of least resistance for crack propagation and hence separation of the workpiece 28, as will be further discussed below.

The series 82 of fault lines 54 form a contour 86 that is patterned to follow the length 30 of the bond 12, so that each fault line 54 in the series 82 extends through the bond 12. In the illustrated embodiment, the bond 12 is straight and thus the contour 86 of the series 82 of fault lines 54 is straight as well. However, in other embodiments, the bond 12 is curved along its length 30, and the contour 86 of the series 82 of fault lines 54 is curved as well. Translating either the workpiece 28 or the second laser energy 52 with respect to the other in two dimensions instead of one dimension, for example, can produce a curved contour 86.

In general, the higher the available laser power providing the second laser energy 52, the faster the contour 86 in the workpiece 28 is formed. The laser power is equal to the burst energy multiplied by the burst repetition frequency (rate) of the laser. For example, a 0.4 m/sec speed of forming the series 82 of fault lines 54 at 3 μm distance 84 between fault lines 54 and 40 μJ/burst would require at least a 5 Watt laser.

However, it should be noted that raising the laser pulse energy or reducing the distance 84 between the fault lines 54 are not conditions that always make the contour 86 separate (in a subsequent step, described below) better or with improved edge quality. If the distance 84 between the fault lines 54 is too small (for example <0.1 micron, in some exemplary embodiments <1 μm, or in some embodiments <2 μm), then the formation of nearby subsequent fault lines 54 can be inhibited, and often can hinder the separation of the workpiece 28 at the contour 86, and may also result in increased unwanted micro cracking within the workpiece 28. If the distance 84 is too long (>50 μm, and in some workpieces >25 μm or even >20 μm), then cracking might occur uncontrollably rather than along the series 82 of fault lines 54. Too high of a burst energy (e.g., >2500 μJ/burst, and in some embodiments >500 μJ/burst) used to form each fault line 54 can cause already formed portions of the contour 86 to melt and reform, which will inhibit separation of the workpiece 28. Accordingly, in embodiments, the burst energy is <2500 μJ/burst, for example, ≤500 μJ/burst. Also, using a burst energy that is too high can cause formation of microcracks that are extremely large and create flaws, which reduce the edge strength following separation. Too low a burst energy (<40 μJ/burst) may result in no appreciable cracking between the fault lines 54, which hinders or prevents separation of the workpiece 28 along the contour 86.

Separating the Workpiece Along the Contour

Figure 8:
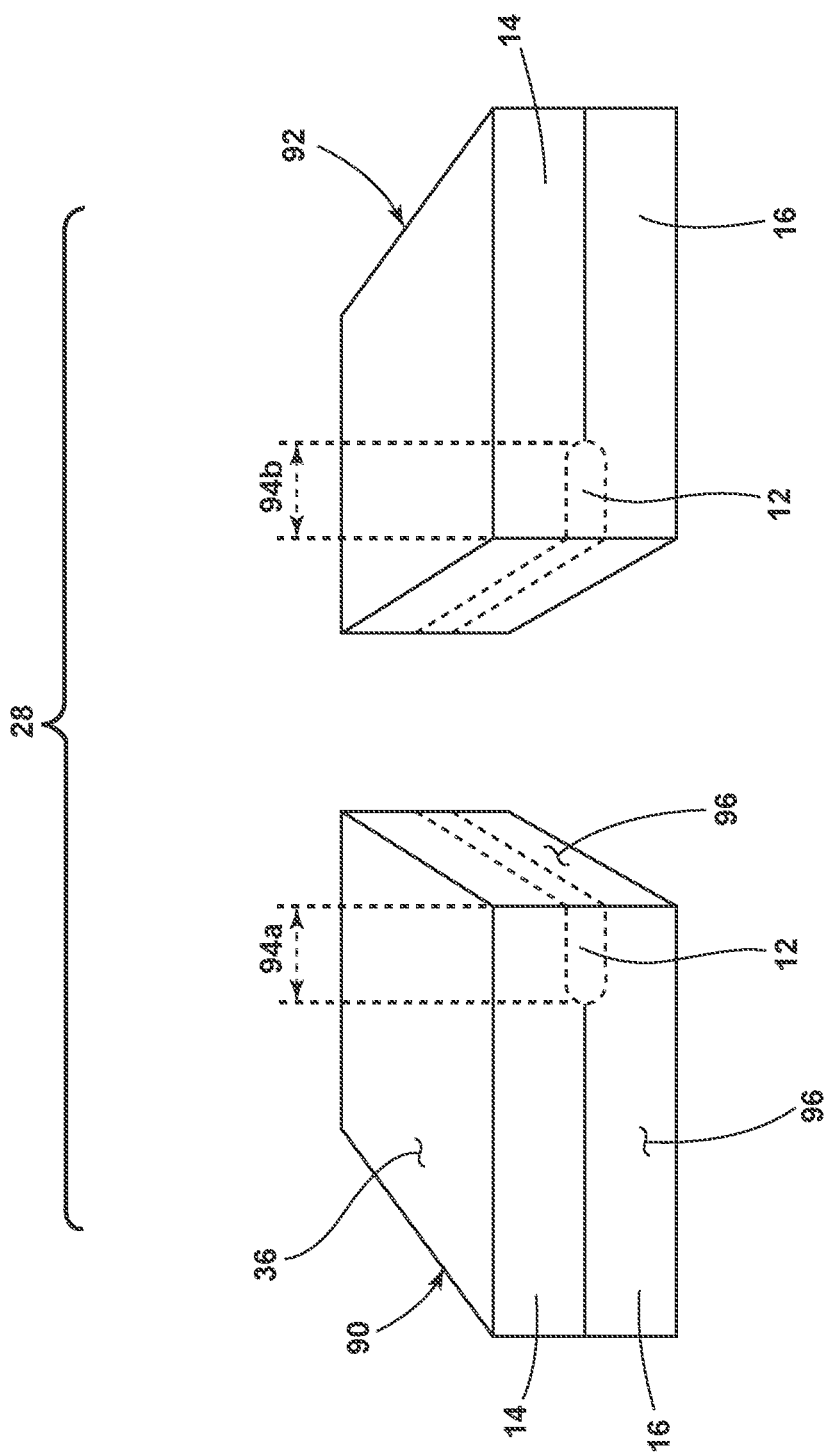
FIG. 8 is a perspective view of the workpiece having been separated into a first portion and a second portion along the contour, according to another step of the method of FIG. 1, illustrating both the first portion and the second portion incorporating a portion of the width of the original bond, and an edge of the first portion not having an interface because the bond provides a contiguous transition between the first substrate and the second substrate.

Referring now additionally to FIG. 8, in an optional step 88, the method 10 further comprises separating a first portion 90 of the workpiece 28 from a second portion 92 of the workpiece 28 along the contour 86. Once the series 82 of fault lines 54 is formed along the contour 86, if the workpiece 28 has sufficient internal stress, cracks will propagate along the contour 86 between the fault lines 54 and the workpiece 28 will separate into the first portion 90 and the second portion 92. In such a circumstance, no secondary separation processes, such as tension/bending forces or thermal stress created, for example, by a $CO_2$ laser, are necessary to separate the workpiece 28.

In embodiments, if the workpiece 28 lacks sufficient internal stress to initiate cracks between the fault line 54 along the contour 86, then separating the first portion 90 of the workpiece 28 from the second portion 92 of the workpiece 28 along the contour 86 includes applying mechanical or thermal stress to the workpiece 28 on or around the contour 86. Mechanical stress on or around the contour 86 creates tension that pulls the first portion 90 and the second portion 92 apart along the contour 86 and breaks the areas of the workpiece 28 that are still bonded together along the contour 86. Mechanical stress can be applied manually by using breaking pliers, bending the workpiece 28 by hand or with a dedicated tool, or any method that creates sufficient tension that initiates and propagates the separation along the contour 86.

Similarly, a heat source can create thermal stress around each of the fault lines 54 and thus cause the workpiece 28 to be in tension along the contour 86 and induce separation along the contour 86. In embodiments, the workpiece 28 is placed in a chamber, such as an oven, to create a bulk heating or cooling of the workpiece 28 that causes thermal stress that separates the first portion 90 and the second portion 92 along the contour 86. However, such a process can be slow. In other embodiments, some other laser energy can be used to create thermal stress to separate it. For example, a subsequent pass of a $CO_2$ laser along or near the contour 86 creates thermal stress that separates the workpiece 28 along the contour 86. The optional $CO_2$ laser separation is achieved, for example, with a defocused continuous wave (cw) laser emitting at 10.6 microns and with power adjusted by controlling its duty cycle. Focus change (i.e., extent of defocusing up to and including focused spot size) is used to vary the induced thermal stress by varying the spot size. Defocused laser beams include those laser beams that produce a spot size larger than a minimum, diffraction-limited spot size on the order of the size of the laser wavelength. For example, $CO_2$ laser spot sizes of 1 to 20 mm, such as 1 to 12 mm, 3 to 8 mm, or about 7 mm, 2 mm, and 20 mm can be used for $CO_2$ lasers, for example, with a $CO_2$ 10.6 μm wavelength laser. Other lasers, whose emission wavelength is also absorbed by the workpiece 28, may also be used, such as lasers with wavelengths emitting in the 9-11 micron range, for example. In such cases, $CO_2$ laser with power levels between 100 and 400 Watts may be used, and the beam may be scanned at speeds of 50-500 mm/sec along or adjacent to the contour 86, which creates sufficient thermal stress to induce separation. The exact power levels, spot sizes, and scanning speeds chosen within the specified ranges may depend on the material(s) used, the thickness 46 of the workpiece 28, coefficient of thermal expansion (CTE), and elastic modulus, since all of these factors influence the amount of thermal stress imparted by a specific rate of energy deposition at a given spatial location. If the spot size is too small (i.e. <1 mm), or the $CO_2$ laser power is too high (>400 W), or the scanning speed is too slow (less than 10 mm/sec), the workpiece 28 may be overheated, creating ablation, melting, or thermally generated cracks in the workpiece 28, which are undesirable, as they will reduce the strength of the edges of the first portion 90 and the second portion 92. Preferably, the $CO_2$ laser beam scanning speed is >50 mm/sec, in order to induce efficient and reliable part separation. However, if the spot size created by the $CO_2$ laser is too large (>20 mm), or the laser power is too low (<10 W, or in some cases <30 W), or the scanning speed is too high (>500 mm/sec), insufficient heating occurs which results in too low a thermal stress to induce separation. Separation along the contour 86 will occur very quickly (less than 1 second) after $CO_2$ spot passes a given location, for example, within 100 milliseconds, within 50 milliseconds, or within 25 milliseconds. More on formation of the series 82 of fault lines 54, the contour 86, and separation of the first portion 90 and the second portion 92 can be obtained from U.S. Pat. No. 9,850,160 B2, which is incorporated herein by reference in its entirety.

After the separation, each of the first portion 90 and the second portion 92 include the first substrate 14, the second substrate 16, and a portion 94a, 94b of the width 32 of the bond 12 from the workpiece 28 before separation of the first portion 90 and the second portion 92. For example, if the width 32 of the bond 12 of the workpiece 28 was 10 μm before the step 88, then the portion 94a of the width 32 in the first substrate 14 after step 88 might be 5 μm, and the portion 94b of the width 32 in the second substrate 16 after step 88 might be 5 μm.

The first portion 90 separated from the workpiece 28 has one or more edges 96a, 96b, . . . 96n. The one or more edges 96a, 96b, . . . 96n form a perimeter around the first portion 90. The one or more edges 96a, 96b, . . . 96n can be at least approximately orthogonal to the incident surface 36 and the opposite surface 48. At least one of the one or more edges 96a, 96b, . . . 96n includes at least a portion of the bond 12 between the first substrate 14 and the second substrate 16. For example, the bond 12 between the first substrate 14 and the second substrate 16 is part of the edge 96a, along with the first substrate 14 and the second substrate 16. Although with the first portion 90 illustrated, the bond 12 exists only along the edge 96a, the bond 12 can also exist along the edge 96b, and any edge 96 of the one or more edges 96a, 96b, ... 96n, depending on the shape of the length of the strip 26 and subsequent bond 12 made from the strip 26 in the prior step 18. In embodiments, as more fully detailed below, the bond 12 is contiguous around the perimeter of the first substrate 14, that is all edges 96a, 96b, ... 96n, which seals the interface between the first substrate 14 and second substrate 16.

Third Laser Energy to Form the Strip from a Larger Layer of Absorption Material

Figure 9:
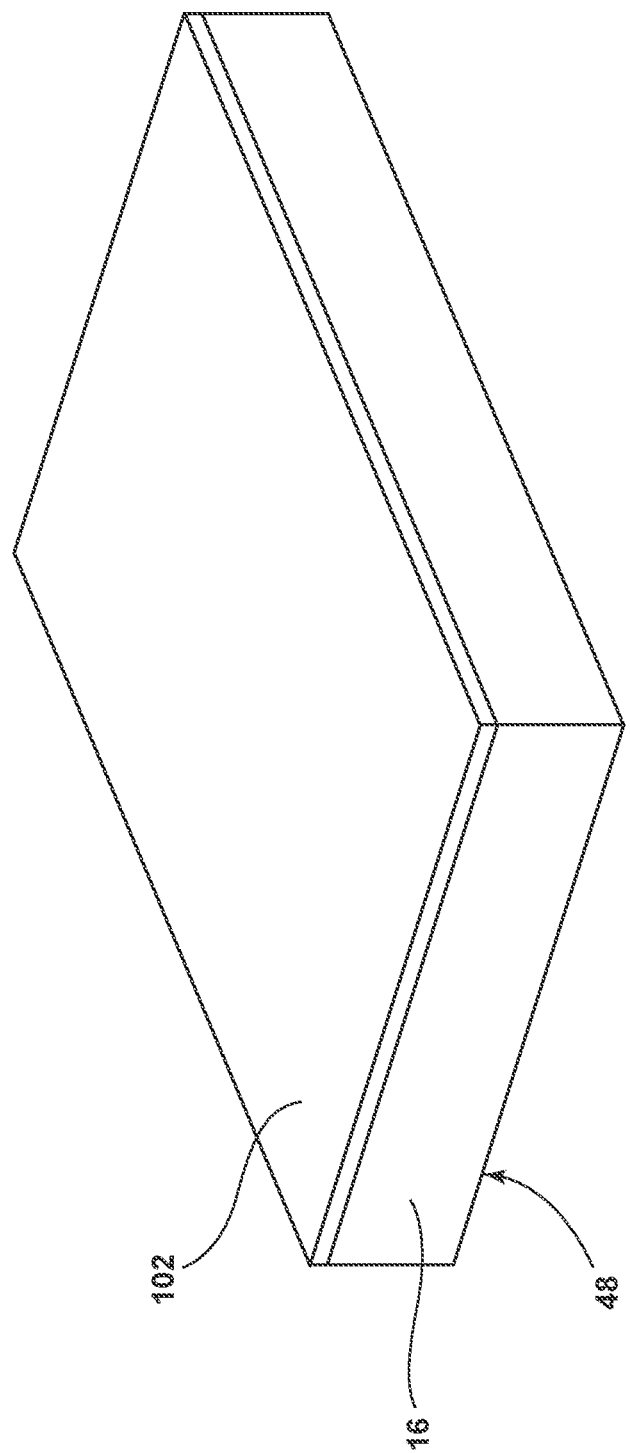
FIG. 9 is a perspective view of a layer of the absorption material disposed over the second substrate of FIG. 2 instead of the strip as mentioned in connection with FIGS. 2 and 3.
Figure 10:
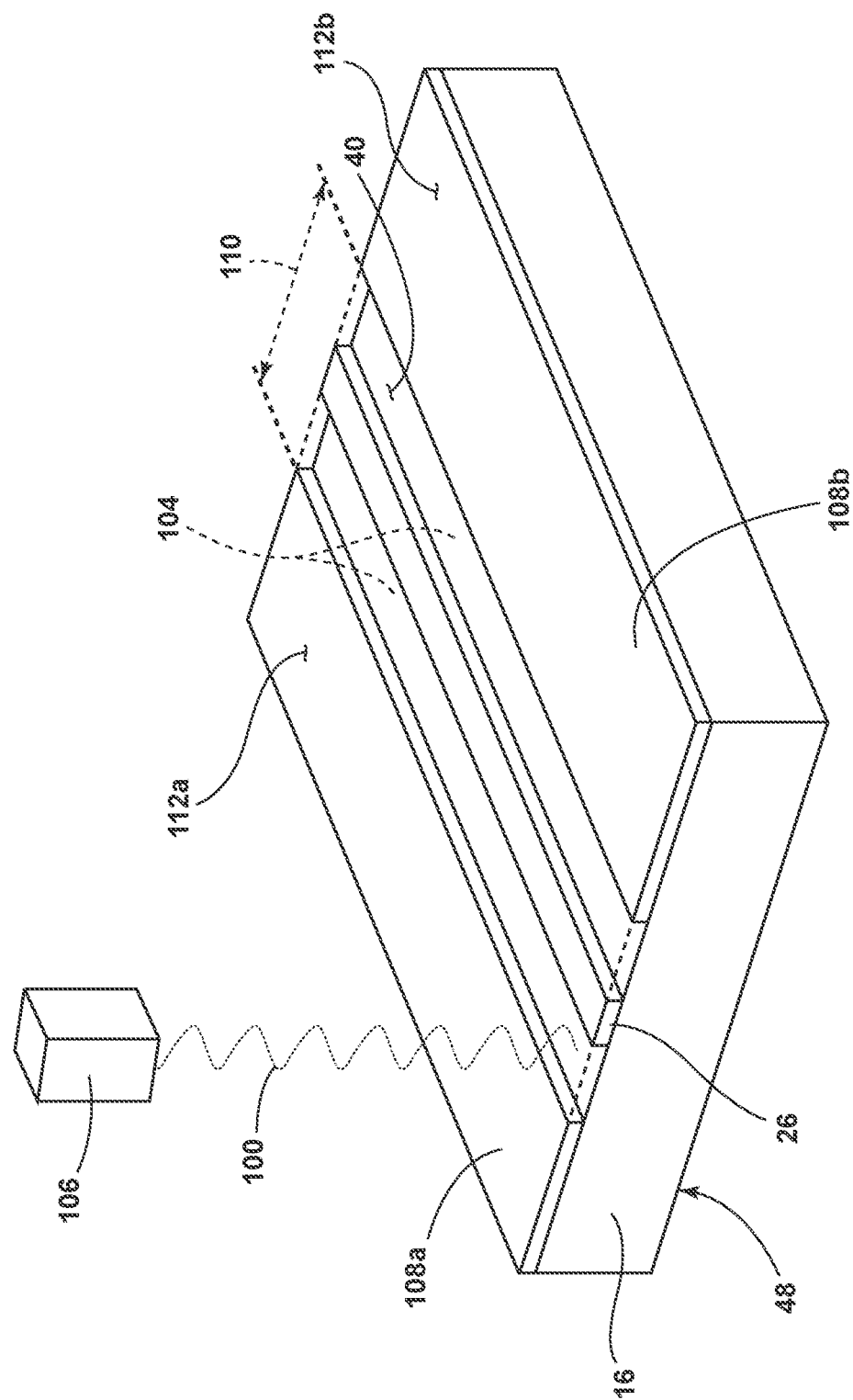
FIG. 10 is a perspective view of a third laser energy ablating portions of the layer of absorption material to form the strip of FIGS. 2 and 3, according to an optional preceding step of the method of FIG. 1, illustrating regions of the absorption material remaining on the second substrate lateral to each side of the strip, and the strip will be subsequently diffused to form a bond between the first substrate and the second substrate, thereby creating a workpiece as illustrated in FIG. 4 but further including the regions of the absorption material lateral to the bond.

Referring now additionally to FIGS. 9 and 10, the method 10 optionally further includes, at step 98, emitting a third laser energy 100 onto a layer 102 of the absorption material disposed on either of the first substrate 14 or the second substrate 16 to remove a portion 104 of the absorption material to form the strip 26 of absorption material. Rather than depositing the absorption material on, for example, the interface surface 40 (opposite of the opposite surface 48) of the second substrate 16 as the strip 26 per se, the strip 26 can be formed from the larger layer 102 of the absorption material previously applied to the interface surface 40 of the second substrate 16. A laser 106 can then emit the third laser energy 100 to ablate the portions 104 (illustrated in phantom) of the layer 102. The third laser energy 100 sufficient to ablate the portions 104 of the layer 102 depends on the absorption material. The removed portions 104 leave the strip 26 of the absorption material remaining on the interface surface 40 of the second substrate 16. This step 98 can be performed before the step 18, and after the strip 26 is formed via step 98, the first substrate 14 can be positioned over the second substrate 16 with the strip 26 in between in preparation for the forming of the bond 12 in step 18. Instead of the interface surface 40 of the second substrate 16, the layer 102 of the absorption material can be applied to, and subsequently ablated from, the interface surface 38 of the first substrate 14 to form the strip 26.

Although the removed portions 104 are described as being removed by laser ablation to leave the strip 26 of absorption material, other embodiments are included in this disclosure. For example, in some embodiments, the removed portions 104 are removed by etching, lithography, mechanical removal, or another suitable process of removing a portion of the absorption material. In some embodiments, the absorption material is patterned during application such that the strip 26 is applied between the removed portions 104 (e.g., by printing, masking prior to application, or another suitable patterning process).

In embodiments, after the strip 26 of the absorption material is formed, a first region 108a of the initially deposited layer 102 of the absorption material remains disposed between the first substrate 14 and the second substrate 16 (such as on the interface surface 40 of the second substrate 16) lateral to the strip 26. In addition, a second region 108b of the initially deposited layer 102 of the absorption material remains disposed between the first substrate 14 and the second substrate 16 (such as on the interface surface 40 of the second substrate 16) also lateral to the strip 26, but to the opposite side of the strip 26 as the first region 108a. The same concept applies if the layer 102 had been initially deposited onto the interface surface 38 of the first substrate 14 instead. The first region 108a and the second region 108b of the absorption material remain between the first substrate 14 and the second substrate 16 after the strip 26 diffuses to form the bond 12 between the first substrate 14 and the second substrate 16 pursuant to step 18 described above. The first region 108a and the second region 108b of the absorption material, as will be discussed further below, can be conductive and serve functional purposes in the end application of the workpiece 28.

Figure 11:
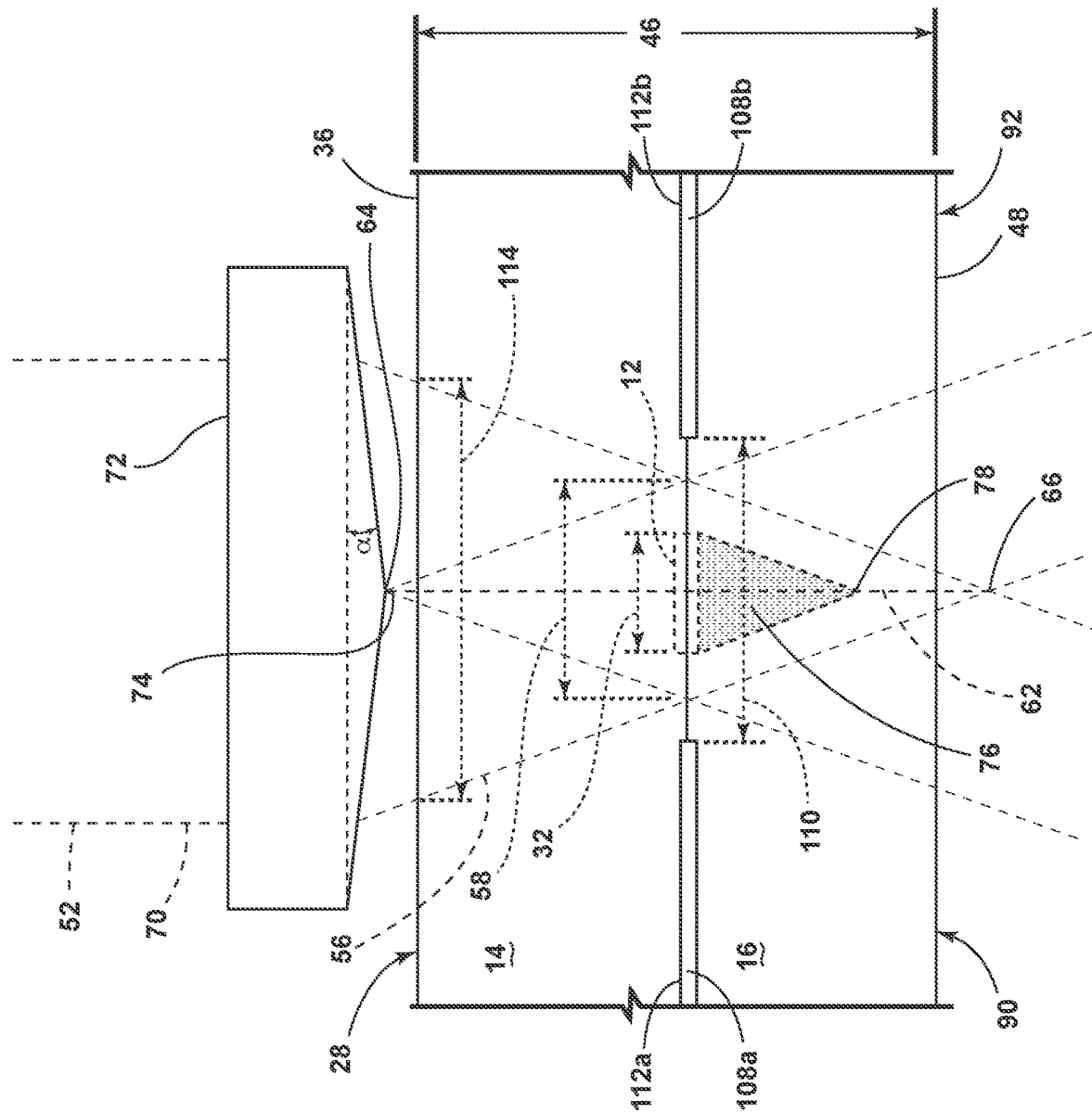
FIG. 11 is a cross-sectional view of the second laser energy generating a focal line of high energy intensity extending through the thickness of the workpiece mentioned in FIG. 10 having the bond disposed between regions of the absorption material, illustrating the second laser energy having a profile of an approximate Bessel beam, and the approximate Bessel beam profile having a diameter incident upon the bond that is smaller than a distance between the regions of the absorption material such that the regions of absorption material do not interfere with the formation of the focal line that generates the fault line through the workpiece.
Figure 12:
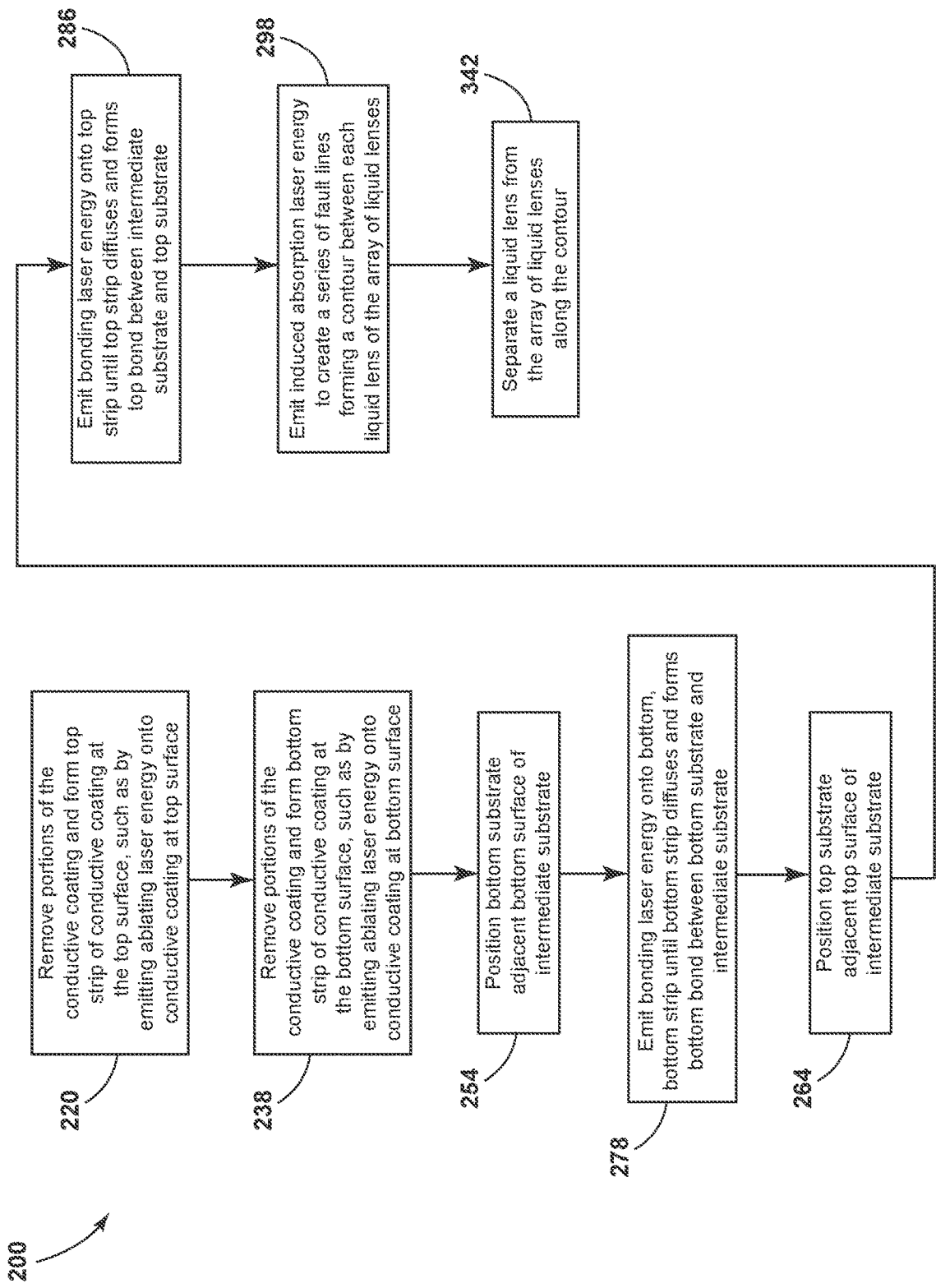
FIG. 12 is a flow chart of a method of manufacturing a liquid lens incorporating the principles of the method of FIG. 1.
Figure 13:
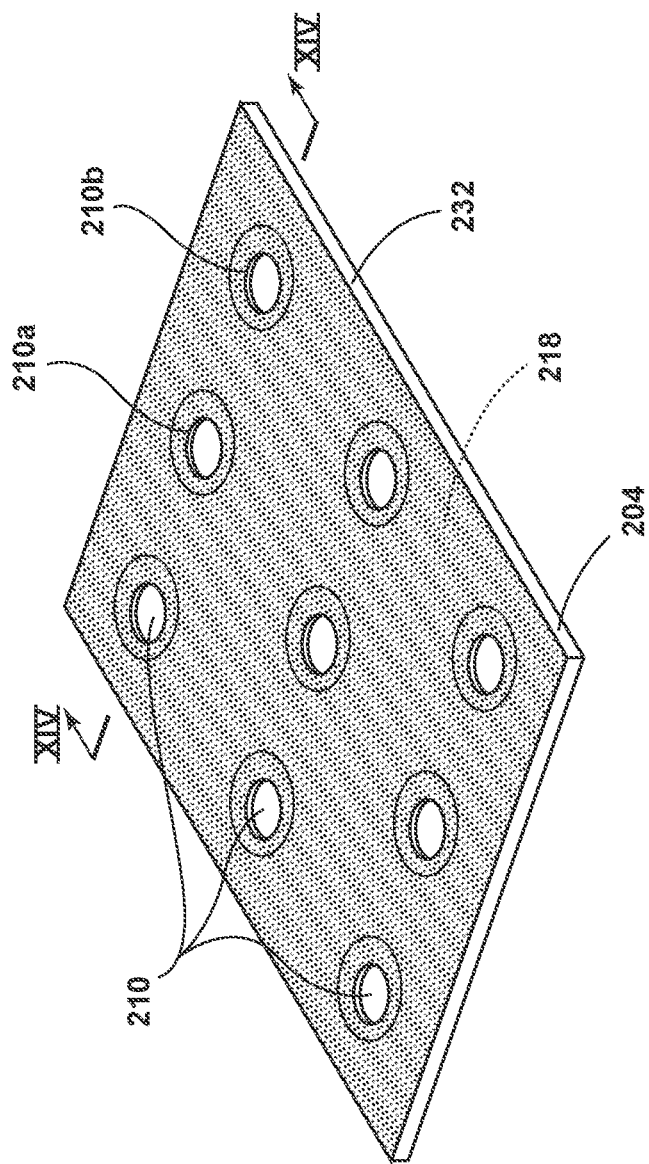
FIG. 13 is a perspective view of an intermediate substrate with a plurality of through holes and a conductive coating disposed over the top surface and bottom surface of the intermediate substrate.
Figure 14:
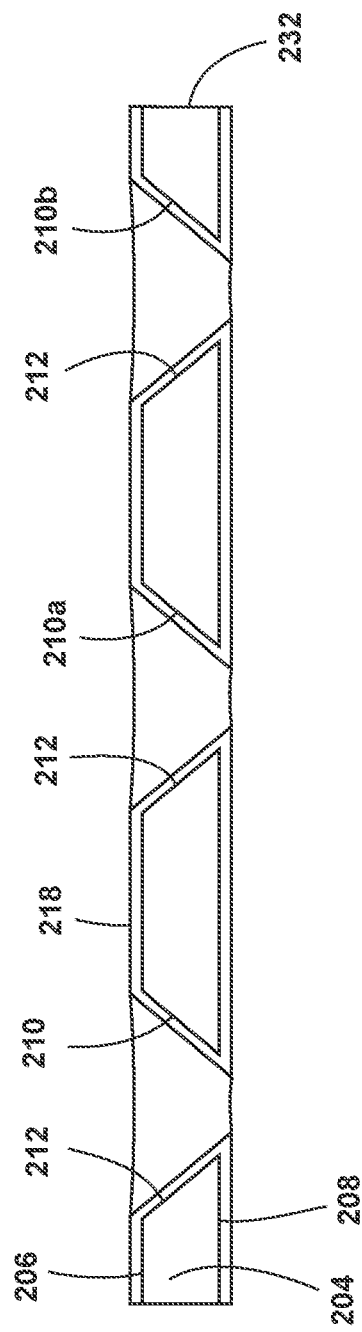
FIG. 14 is a cross-sectional view taken through line XIV-XIV of FIG. 13, illustrating the conductive coating covering the top surface, bottom surface, and through hole surfaces of the intermediate substrate.

Referring now additionally to FIG. 11, in embodiments, the first region 108a and the second region 108b remaining lateral to the strip 26 and thus the bond 12 do not interfere with the approximated Bessel beam 56 during generation of the fault line 54 in step 50. For example, the removed portions 104 of the layer 102 of the absorption material define clear or open areas on opposing sides of the strip 26 and thus the bond 12 through which portions of the approximated Bessel beam 56 can pass to form the desired focal line 62 as described herein. Thus, forming the removed portions 104 as described herein can enable forming the series 82 of fault lines 54 as described herein despite the presence of the strip 26 and/or the bond 12 (e.g., at the perimeter of the workpiece 28 also as described herein). If either or both of the first region 108a and the second region 108b were to interfere with the approximated Bessel beam 56, then the resulting focal line 62 would be different than the desired focal line 62 from convergence point 64 to divergence point 66 and thus may be insufficient to cause the fault line 54 through the workpiece 28. In addition, the resulting focal line 62 may be unable to reform from the refocusing point 78 to the divergence point 66 after the disruption zone 76 caused by the bond 12.

The first region 108a and the second region 108b are separated by a distance 110, with the strip 26 disposed between the first region 108a and the second region 108b, before step 18. At step 18, the strip 26 diffuses and the bond 12 forms. The bond 12 is thus disposed within the distance 110 between the first region 108a and the second region 108b of the absorption material remaining between the first substrate 14 and the second substrate 16. For neither the first region 108a nor the second region 108b to interfere with the focal line 62 extending from the convergence point 64 to the divergence point 66 (and thus the generation of the fault line 54), the distance 110 between the first region 108a and the second region 108b can be at least larger than the diameter 58 of the approximated Bessel beam 56 that intersects with an incident plane defined by the first region 108a not the second region 108b. In embodiments, the distance 110 is between 200 µm and 300 µm. The incident plane is an imaginary plane extending from the plane provided by a surface 112a of the first region 108a closest to the incident surface 36 of the workpiece 28 to the plane provided by a surface 112b of the second region 108b closest to the incident surface 36. If the first region 108a and the second region 108b are equidistant from a center of the width 32 of the bond 12 and the focal line 62 is centered through the bond 12, and if the distance 110 between the first region 108a and the second region 108b is at least larger than the diameter 58 of the approximated Bessel beam 56, then neither the first region 108a nor the second region 108b of the absorption material will interfere with the approximated Bessel beam 56 formation of the focal line 62 between the refocusing point 78 and the divergence point 66. In any other scenario, the distance 110 can be larger. In embodiments, the distance 110 is 1% larger than the diameter 58. In other embodiments, the distance 110 is 5%, or 10%, or 15%, or between 1% and 5%, or between 1% and 10%, or between 1% and 15% larger than the diameter 58. Because the removed portions 104 of the layer 102 of the absorption material are ablated in step 98 with the third laser energy 100, the distance 110 between the first region 108a and the second region 108b of the absorption material remaining, and their equidistance from the strip 26, can be controlled and minimized so as to maximize the first region 108a and the second region 108b remaining without interfering with the approximated Bessel beam 56. In some embodiments, the approximated Bessel beam 56 has a diameter 114 at the incident surface 36 of the workpiece 28 that is greater than the distance 110 between the first region 108a and the second region 108b of the layer 102 of the absorption material remaining between the first substrate 14 and the second substrate 16. In embodiments, the workpiece 28 is an array of liquid lenses. In embodiments, the workpiece is an array of micro-electro-mechanical systems ("MEMS") devices, microfluidic devices, or other types of devices that can be manufactured using a wafer manufacturing process.

Method of Manufacturing a Liquid Lens Using the Principles of the Above Method

Referring now to FIGS. 12, 13, 15-17, 25, and 26, a method 200 of manufacturing a workpiece 28 is described. To provide context, the workpiece 28 illustrated in describing the method 200 is a liquid lens 202. However, it should be understood that the workpiece 28 manufactured with this method 200, in other embodiments, is a microfluidic device. In still other embodiments of this method 200, the workpiece 28 manufactured is a MEMS or other type of device manufactured using a wafer manufacturing process.

An intermediate substrate 204 used with this method 200 has a top surface 206, a bottom surface 208, and a plurality of through holes 210 (also referred to as bores) that provide a plurality of through hole surfaces 212 that extend from the top surface 206 to the bottom surface 208. The intermediate substrate 204 can comprise a metallic, a polymeric, a glass, a ceramic, and/or a glass-ceramic composition. In embodiments, the intermediate substrate 204 is essentially transparent to the first laser energy 20 and the second laser energy 52 described above, and which are referred to below as a bonding laser energy 214 and an induced absorption laser energy 216, respectively. In the illustrated embodiment, the intermediate substrate 204 is a glass substrate comprising a glass composition. A conductive coating 218, akin to the absorption material described above, has been applied to and covers the top surface 206, the bottom surface 208, and the plurality of through hole surfaces 212. In some embodiments, the conductive coating 218 is applied in a manner that forms a top strip 226 of the conductive coating 218 at the top surface 206 that is separated from top regions 228 of the conductive coating 218 that are located nearer the through holes 210 than the top strip 226. Similarly, in some embodiments, the conductive coating 218 is applied in a manner that forms a bottom strip 242 of the conductive coating 218 at the bottom surface 208 that is separated from bottom regions 244 of the conductive coating 218 that are located nearer the through holes 210 than the top strip 226.

Figure 15:
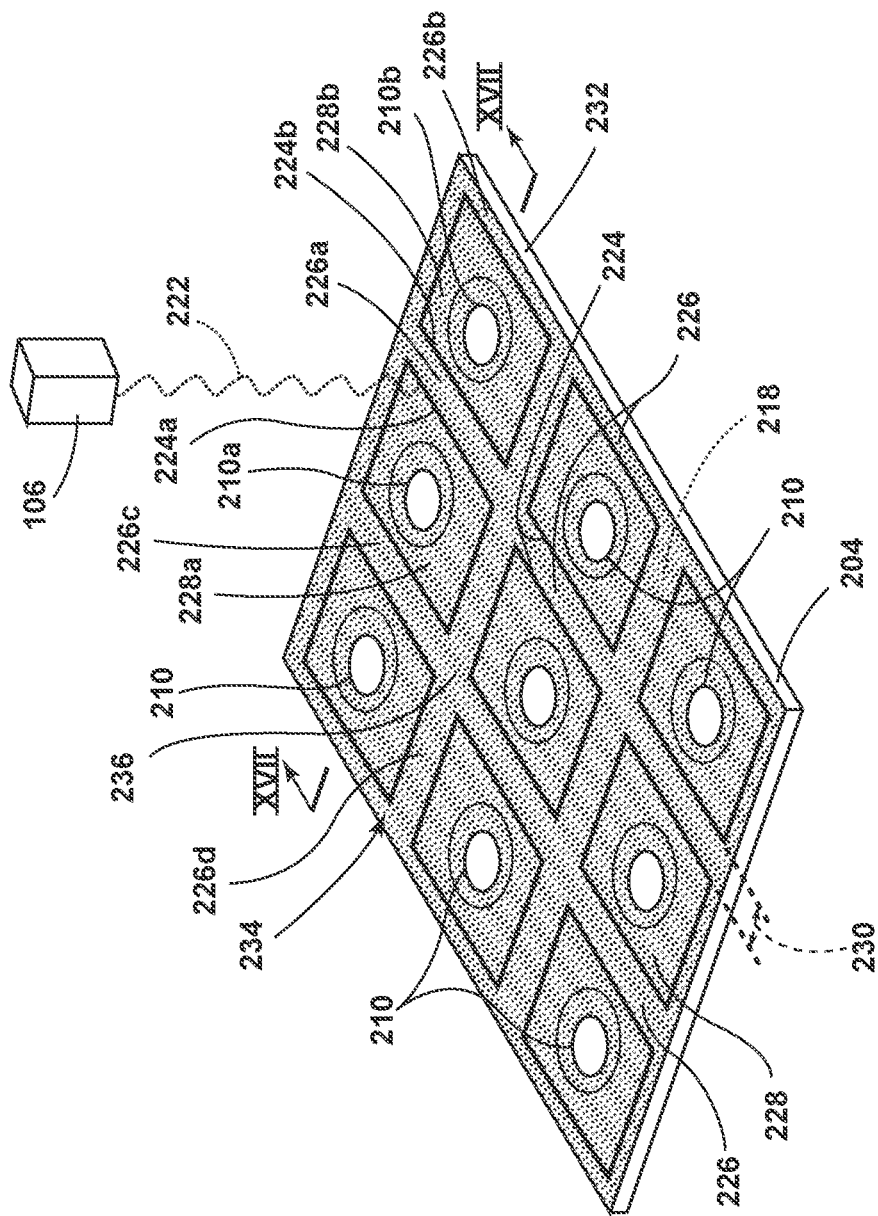
FIG. 15 is a perspective view of ablating laser energy removing portions of the conductive coating from the top surface of the intermediate substrate, according to a step of the method of FIG. 12, illustrating the removed portions creating a top strip of conductive coating, which forms a grid extending around a perimeter of the intermediate substrate and between each of the through holes.
Figure 16:
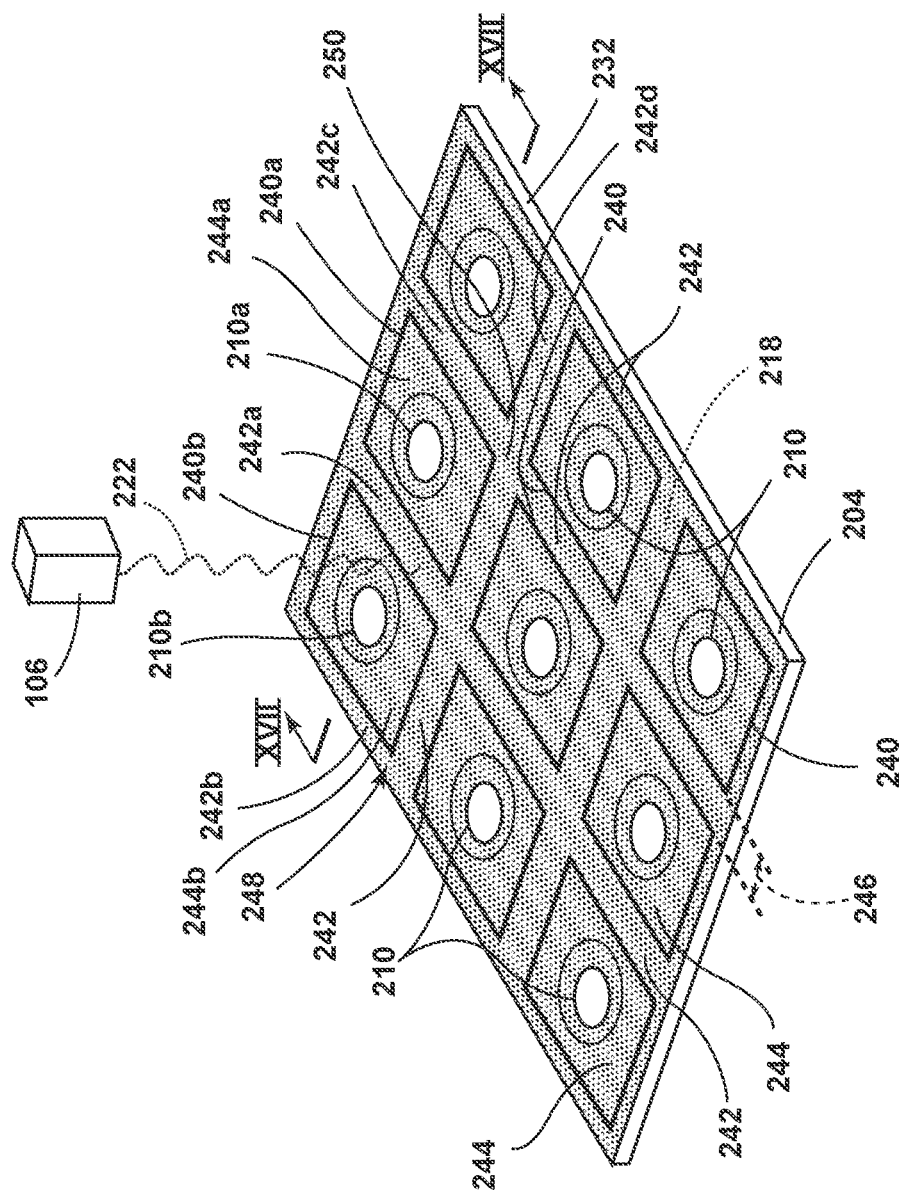
FIG. 16 is a perspective view of ablating laser energy removing portions of the conductive coating from the bottom surface of the intermediate substrate, according to another step of the method of FIG. 12, illustrating the removed portions creating a bottom strip of conductive coating, which forms a grid extending around the perimeter of the intermediate substrate and between each of the through holes, in the same pattern as the top strip.
Figure 17:
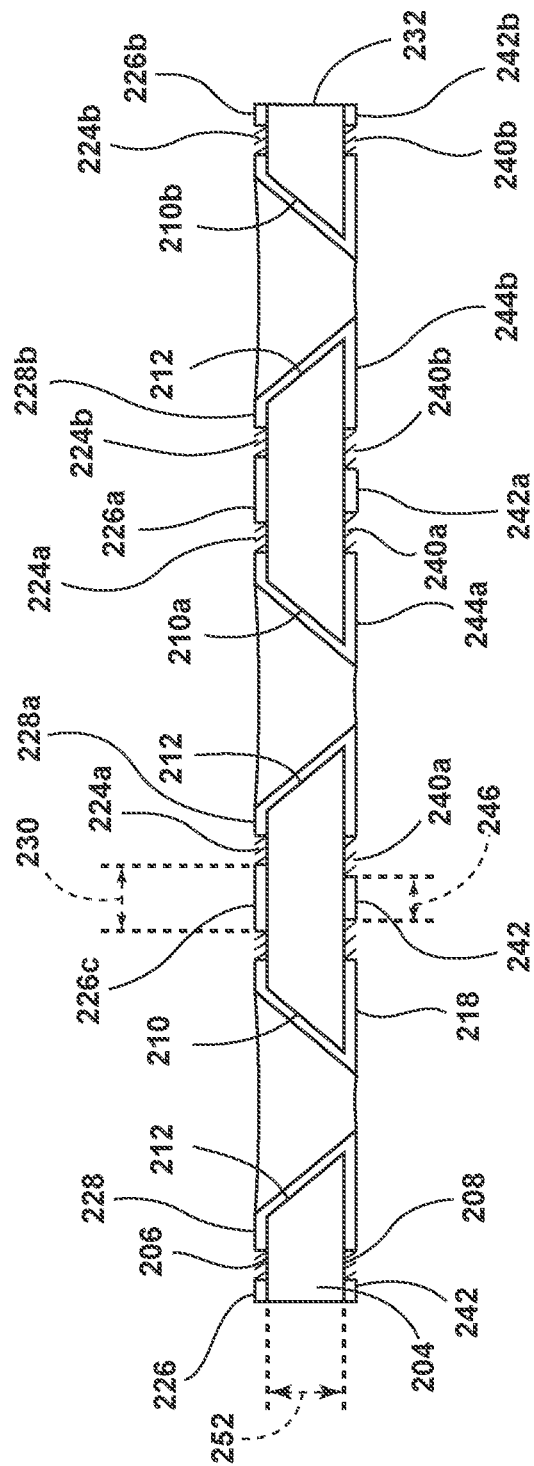
FIG. 17 is a cross-sectional view taken through line XVII-XVII of FIGS. 16 and 17, illustrating the removed portions of the conductive coating on both the top surface and the bottom surface of the intermediate substrate, as well as the top strip overlapping the bottom strip separated by a thickness of the intermediate substrate.

Referring now particularly to FIGS. 15-17, in other embodiments, the conductive coating 218 is applied to cover the top surface 206, the bottom surface 208, and the plurality of through hole surfaces 212 of the intermediate substrate 204 without the top regions 228 and the bottom regions 244 being formed during application of the conductive coating 218. In such a circumstance, the method 200, at step 220, comprises removing top portions 224 of the conductive coating 218 disposed at the top surface 206 to form a top strip 226 of the conductive coating 218 disposed at the top surface 206. In embodiments, step 220 comprises emitting an ablating laser energy 222 (the third laser energy 100 from the method 10 above) onto the conductive coating 218 disposed at the top surface 206 to remove the top portions 224 of the conductive coating 218 and thus form the top strip 226 of the conductive coating 218 disposed at the top surface 206. The top strip 226 of the conductive coating 218 at the top surface 206 is disposed laterally adjacent to the top region 228 of the conductive coating 218 that is disposed closer to one of the through holes 210 than the top strip 226, and the top region 228 is separated from the top strip 226 by a distance 378. For example, the ablating laser energy 222 ablating top portions 224a, 224b of the conductive coating 218 leaves the portion of the top strip 226 identified as 226a of the conductive coating 218 between the top portions 224a, 224b that were ablated. This portion 226a of the top strip 226 extends between through holes 210a, 210b. The ablating laser energy 222 ablating the top portions 224a, 224b of the conductive coating 218 additionally leaves top regions 228a, 228b of the conductive coating 218 that are disposed closer to through holes 210a, 210b, respectively, than this portion 226a of the top strip 226. Top regions 228a, 228b are thus equivalent to the first region 108a and the second region 108b described in connection with the method 10 above that were disposed lateral to the strip 26 after removal of the removed portions 104. The portion 226a of the top strip 226 is disposed between the two top regions 228a, 228b of the conductive coating 218. The top strip 226 that is disposed between the top regions 228 of the conductive coating 218 has a width 230. In embodiments, the width 230 is between 5 µm and 350 µm, such as between 10 µm and 100 µm.

As another example, the ablating laser energy 222 ablating top portion 224b of the conductive coating 218 leaves a portion 226b of the top strip 226 of the conductive coating 218 adjacent to only that top region 228b. This portion 226b of the top strip 226 is disposed adjacent to one of the through holes 210b and does not extend between the through holes 210. In the illustrated embodiment, this portion 226b of the top strip 226 is coterminous with an edge 232 of the intermediate substrate 204.

As in the illustrated embodiment, the top portions 224 of the conductive coating 218 that the ablating laser energy 222 removed at the top surface 206 surround each of the through holes 210. For example, the removed top portion 224a forms a square surrounding through hole 210a, and the removed top portion 224b forms a square surrounding the through hole 210b. The removed top portion 224a additionally surrounds the top region 228a of the conductive coating 218 remaining around the through hole 210a, and the removed top portion 224b additionally surrounds top region 228b of the conductive coating 218 remaining around the through hole 210b. Instead of using the ablating laser energy 222 for this step 220 to remove top portions 224 of the conductive coating 218, a photoresist based masking technique (e.g., a photolithographic technique) or another suitable patterning technique can be utilized.

As in the illustrated embodiment, the top strip 226 can form a grid 234 with portions of the top strip 226 intersecting. For example, a portion 226c of the top strip 226 and a portion 226d of the top strip 226 intersect at an intersection 236.

In the above-described circumstance where the conductive coating 218 is applied to cover the top surface 206, the bottom surface 208, and the plurality of through hole surfaces 212 of the intermediate substrate 204 without the top region 228 and bottom region 244 being formed during application of the conductive coating, the method 200 further comprises, at step 238, removing bottom portions 240 of the conductive coating 218 disposed at the bottom surface 208 to form a bottom strip 242 of the conductive coating 218 disposed at the bottom surface 208. In embodiments, step 238 comprises emitting ablating laser energy 222 onto the conductive coating 218 disposed at the bottom surface 208 of the intermediate substrate 204 to remove bottom portions 240 of the conductive coating 218 and thus form the bottom strip 242 of the conductive coating 218 at the bottom surface 208. The bottom strip 242 of the conductive coating 218 at the bottom surface 208 is disposed laterally adjacent to the bottom region 244 of the conductive coating 218 that is disposed closer to one of the through holes 210 than the bottom strip 242, and the bottom region 244 is separated from the bottom strip 242 by a distance 380. As an example, the ablating laser energy 222 ablating bottom portions 240a, 240b of the conductive coating 218 leaves a portion 242a of the bottom strip 242 of the conductive coating 218 between the bottom portions 240a, 240b that were ablated. This portion 242a of the bottom strip 242 extends between through holes 210a, 210b. The ablating laser energy 222 ablating the bottom portions 240a, 240b of the conductive coating 218 additionally leaves bottom regions 244a, 244b of the conductive coating 218 that are disposed closer to through holes 210a, 210b respectively than this portion 242a of the bottom strip 242. The portion 242a of the bottom strip 242 is disposed between the two bottom regions 244a, 244b of the conductive coating 218. The bottom strip 242 that is disposed between bottom regions 244 of the conductive coating 218 has a width 246. In embodiments, the width 246 of the bottom strip 242 is between 5 μm and 350 μm, such as between 10 μm and 100 μm. In embodiments, the width 246 of the bottom strip 242 is narrower than the width 230 of the top strip 226—that is, the width 230 of the top strip 226 is wider than the width 246 of the bottom strip 242. In embodiments, the width 230 of the top strip 226 is less than 5% wider than the width 246 of the bottom strip 242. In other embodiments, the width 230 of the top strip 226 is between 5% and 10% wider, or between 10% and 20% wider, or between 20% and 30% wider, or greater than 30% wider than the width 246 of the bottom strip 242.

As another example, the ablating laser energy 222 ablating bottom portion 240b of the conductive coating 218 leaves a portion 242b of the bottom strip 242 of the conductive coating 218 adjacent to only that bottom region 244b. This portion 242b of the bottom strip 242 is disposed adjacent to one through hole 210b and does not extend between through holes 210. In the illustrated embodiment, this portion 242b of the bottom strip 242 is coterminous with the edge 232 of the intermediate substrate 204.

As in the illustrated embodiment, the bottom portions 240 of the conductive coating 218 that the ablating laser energy 222 removed at the bottom surface 208 surround each of the through holes 210. For example, removed bottom portion 240a forms a square surrounding the through hole 210a, and removed bottom portion 240b forms a square surrounding through hole 210b. Removed bottom portion 240a additionally surrounds bottom region 244a of the conductive coating 218 remaining around through hole 210a, and removed bottom portion 240b additionally surrounds bottom region 244b of the conductive coating 218 remaining around through hole 210b. Instead of using the ablating laser energy 222 for this step 238 to remove bottom portions 240 of the conductive coating 218, another suitable patterning technique can be utilized.

As in the illustrated embodiment, the bottom strip 242 can form a grid 248 with portions of the bottom strip 242 intersecting. For example, portion 242c of the bottom strip 242 and portion 242d of the bottom strip 242 intersect at intersection 250. As illustrated in FIG. 17, the top strip 226 and the bottom strip 242 overlap, separated by a thickness 252 of the intermediate substrate 204. For example, the portion 226b of the top strip 226 at the edge 232 is disposed above the portion 242b of the bottom strip 242, separated by the thickness 252 of the intermediate substrate 204. Similarly, the portion 226a of the top strip 226 is disposed above the portion 242a of the bottom strip 242, separated by the thickness 252 of the intermediate substrate 204. The grid 234 that the top strip 226 forms is disposed above the grid 248 that the bottom strip 242 forms, separated by the thickness 252 of the intermediate substrate 204.

Figure 18:
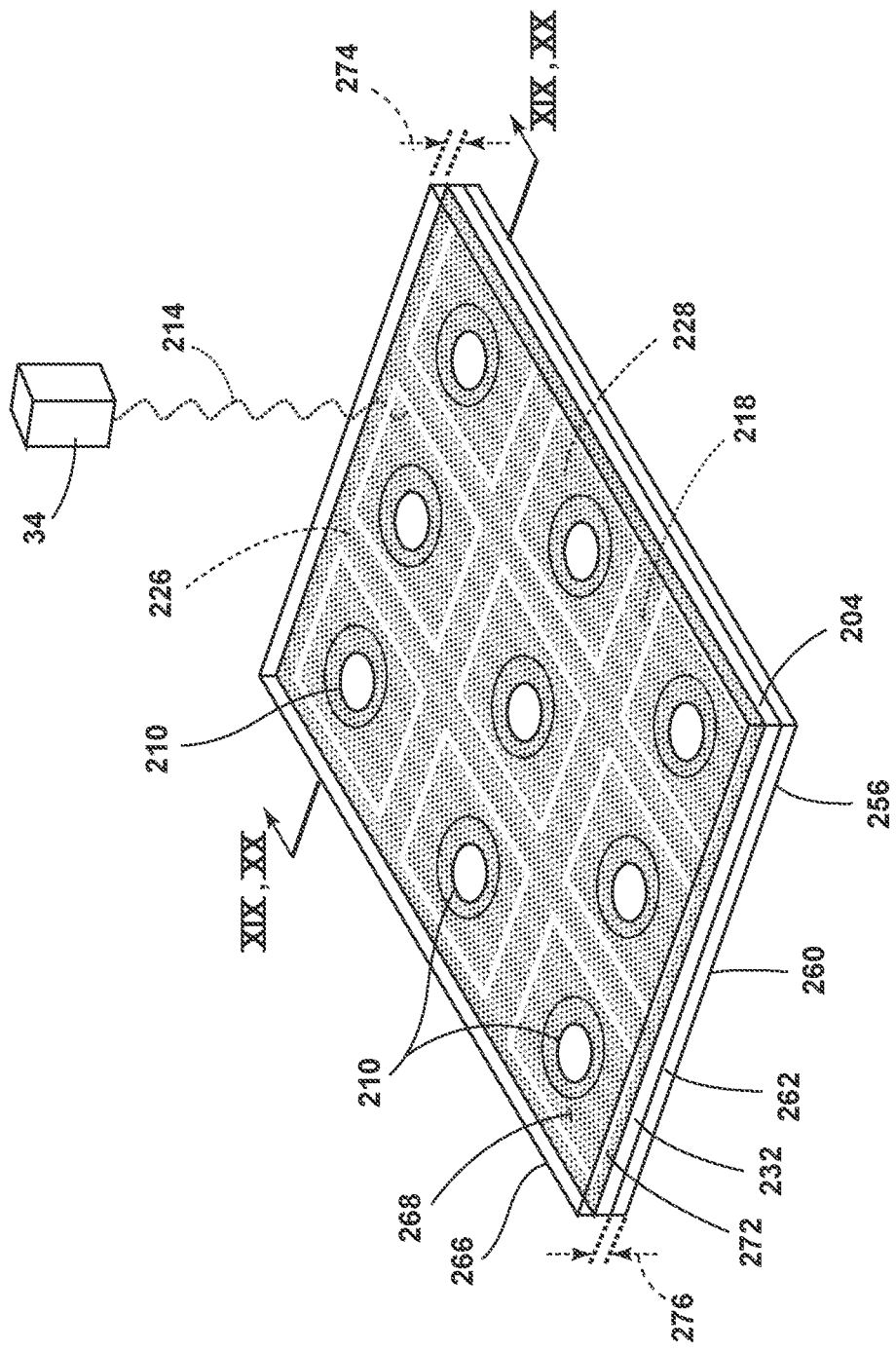
FIG. 18 is a perspective view of a bottom substrate placed under the bottom surface of the intermediate substrate, a top substrate placed over the top surface of the intermediate substrate, and bonding laser energy impinging upon the top strip, according to other steps of the method of FIG. 12.
Figure 19:
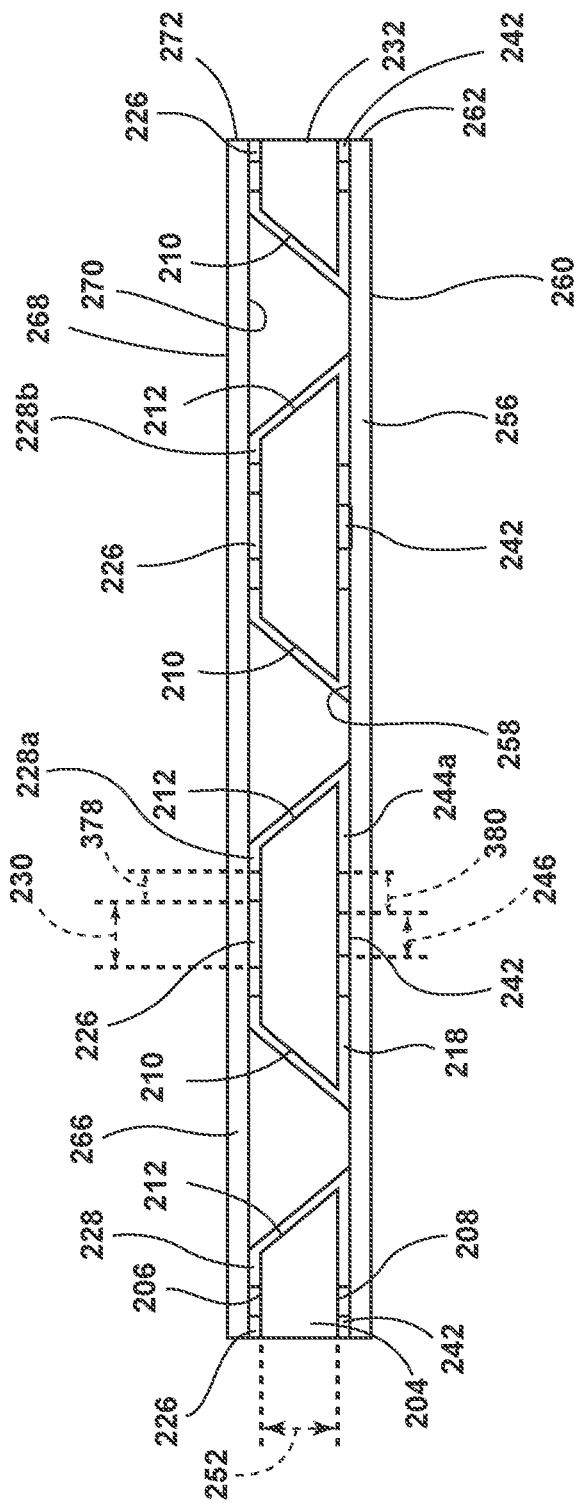
FIG. 19 is a cross-sectional view taken through line XIX-XIX of FIG. 18, at a moment in time before the bonding laser energy has caused the top strip and the bottom strip to diffuse and create a top bond and a bottom bond respectively, illustrating the top substrate over the intermediate substrate, the bottom substrate under the intermediate substrate, and the top strip having a width that is wider than a width of the bottom strip.

Referring now additionally to FIGS. 18 and 19, the method 200 further comprises, at step 254, positioning a bottom substrate 256 adjacent to (such as over or under, depending on orientation) the bottom surface 208 of the intermediate substrate 204. The bottom substrate 256 is positioned such that the bottom substrate 256 covers the plurality of through holes 210 of the intermediate substrate 204 at the bottom surface 208. In addition, the grid 248 and the bottom strip 242 are disposed between the intermediate substrate 204 and the bottom substrate 256. The bottom substrate 256 has an interface surface 258 and an opposite surface 260. The bottom substrate 256 has an edge 262 that extends between the interface surface 258 and the opposite surface 260. The edge 262 of the bottom substrate 256 can be flush with the edge 232 of the intermediate substrate 204.

Figure 20:
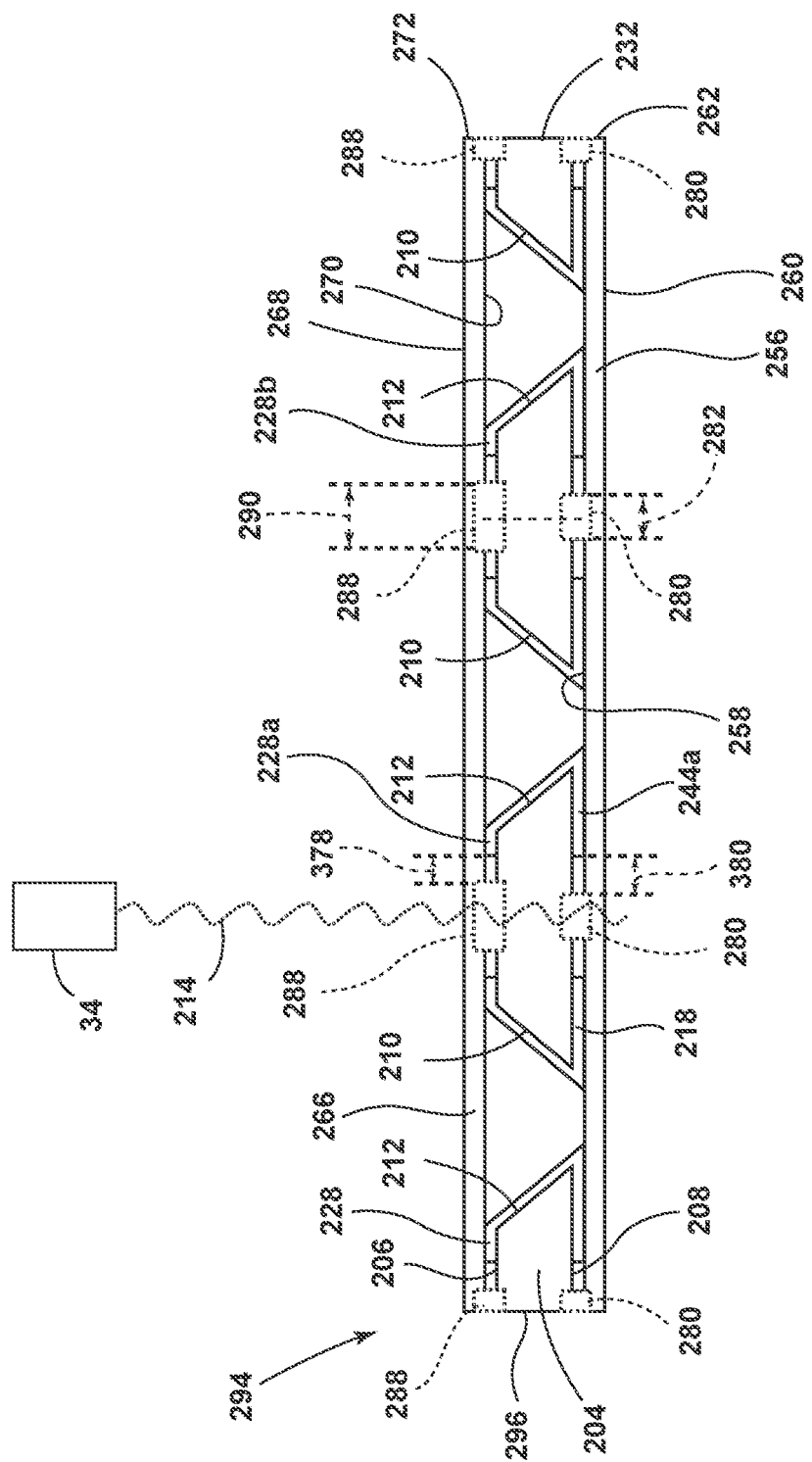
FIG. 20 is a cross-sectional view taken through line XIX-XIX of FIG. 18, after the bonding laser energy has caused the top strip and the bottom strip to diffuse and create the top bond and the bottom bond, respectively, thus forming an array of liquid lenses, illustrating the top bond and the bottom bond forming a sealed edge contiguous with the edges of the top substrate, the intermediate substrate, and the bottom substrate around a perimeter of the array of liquid lenses.
Figure 21:
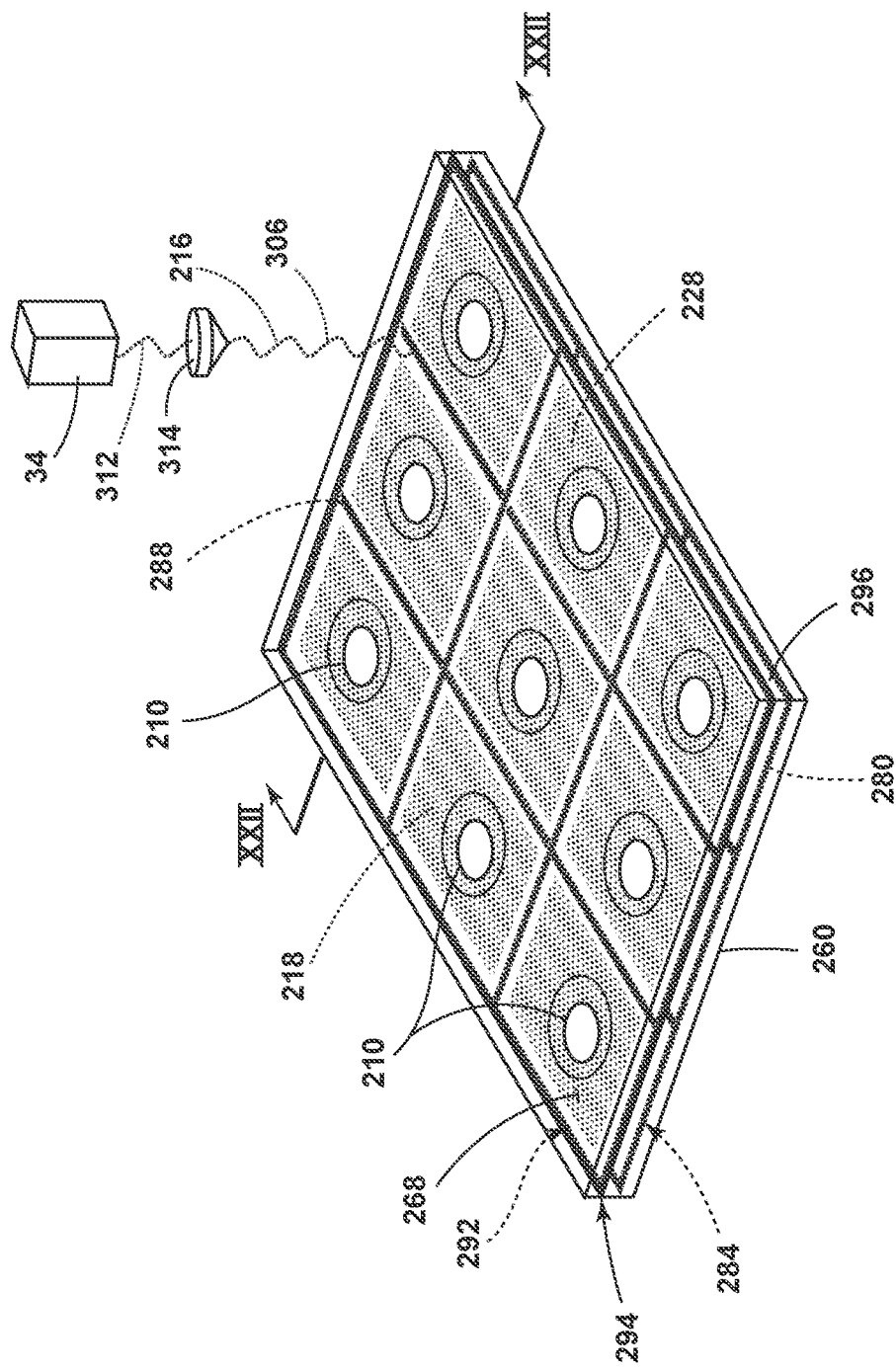
FIG. 21 is a perspective view of induced absorption laser energy impinging on the array of liquid lenses through the top bond and the bottom bond disposed between adjacent liquid lenses of the array of liquid lenses, according to another step of the method of FIG. 12.

Referring now additionally to FIGS. 20-21, the method 200 further comprises, at step 278, emitting the bonding laser energy 214 (the first laser energy 20 from the above method 10) onto the bottom strip 242 until the bottom strip 242 diffuses into the intermediate substrate 204 and the bottom substrate 256 resulting in a bottom bond 280 between the intermediate substrate 204 and the bottom substrate 256, the bottom bond 280 having a width 282 at least approximating the width 246 of the bottom strip 242 before the bottom strip 242 is diffused. The laser 34 emits the bonding laser energy 214. In embodiments, the bonding laser energy 214 first encounters the opposite surface 260 of the bottom substrate 256 after exiting the laser 34. The bonding laser energy 214 has a wavelength, and the bottom substrate 256 is at least essentially transparent to the wavelength of the bonding laser energy 214. In embodiments, the bonding laser energy 214 is provided in the form of a Gaussian laser beam profile. The bottom strip 242 is essentially opaque or blocking to the wavelength of the bonding laser energy 214. Thus, the bottom strip 242 provides a change in the transmissivity from the bottom substrate 256 and absorbs the bonding laser energy 214. The bonding laser energy 214 thus transmits through the bottom substrate 256 and then impinges upon the bottom strip 242. As described above in connection with the strip 26 of absorption material and the method 10, the bottom strip 242 absorbs the energy from the bonding laser energy 214 and diffuses into both of the bottom substrate 256 and the intermediate substrate 204. This diffusion of the bottom strip 242 into the bottom substrate 256 and the intermediate substrate 204 creates the bottom bond 280 between the bottom substrate 256 and the intermediate substrate 204. The bottom bond 280 thus at least partially comprises diffused conductive material from the bottom strip 242 of the conductive coating 218. The bottom regions 244 are separated from the bottom bond 280 by the distance 380. The bottom bond 280 forms a grid 284 generally matching the grid 248 of the bottom strip 242.

The method 200 further comprises, at step 264, positioning atop substrate 266 adjacent to (such as over) the top surface 206 of the intermediate substrate 204 (with the intermediate substrate 204 now bonded to and disposed over the bottom substrate 256). The top substrate 266 is positioned such that the top substrate 266 covers the plurality of through holes 210 of the intermediate substrate 204 at the top surface 206. In addition, the grid 234 and the top strip 226 are disposed between the intermediate substrate 204 and the top substrate 266. The top substrate 266 has an incident surface 268 and an interface surface 270. The top substrate 266 has an edge 272 that extends between the incident surface 268 and the interface surface 270. The edge 272 of the top substrate 266 can be flush with the edge 232 of the intermediate substrate 204.

The method 200 further comprises, at step 286, emitting the bonding laser energy 214 onto the top strip 226 until the top strip 226 diffuses into the intermediate substrate 204 and the top substrate 266 resulting in a top bond 288 between the intermediate substrate 204 and the top substrate 266, the top bond 288 having a width 290 at least approximating the width 230 of the top strip 226 before the top strip 226 is diffused. The laser 34 emits the bonding laser energy 214. In embodiments, the bonding laser energy 214 first encounters the incident surface 268 of the top substrate 266 after exiting the laser 34. The top substrate 266 is at least essentially transparent to the wavelength of the bonding laser energy 214. The top strip 226 is essentially opaque or blocking to the wavelength of the bonding laser energy 214. Thus, the top strip 226 provides a change in the transmissivity from the top substrate 266 and absorbs the bonding laser energy 214. The bonding laser energy 214 thus transmits through the top substrate 266 and then impinges upon the top strip 226. The top strip 226 absorbs the energy from the bonding laser energy 214 and diffuses into both of the top substrate 266 and the intermediate substrate 204. This diffusion of the top strip 226 into the top substrate 266 and the intermediate substrate 204 creates the top bond 288 between the top substrate 266 and the intermediate substrate 204. The top bond 288 thus at least partially comprises diffused conductive material from the top strip 226 of the conductive coating 218. The top regions 228 are separated from the top bond 288 by the distance 378. In embodiments, the distance 380 separating the bottom regions 244 from the bottom bond 280 is smaller than the distance 378 separating the top regions 228 from the top bond 288. In embodiments, both the distance 378 and the distance 380 are between 50 µm and 150 µm. The top bond 288 forms a grid 292 generally matching the grid 234 of the top strip 226.

In embodiments, all of the top substrate 266, the bottom substrate 256, and the intermediate substrate 204 comprise glass compositions. As mentioned above, the intermediate substrate 204 has a thickness 252, which is the straight line distance between the top surface 206 and the bottom surface 208. The incident surface 268 and the interface surface 270 of the top substrate 266, and the interface surface 258 and the opposite surface 260 of the bottom substrate 256, can each be planar or non-planar. The top substrate 266 has a thickness 274, which, in embodiments, is the distance between the incident surface 268 and the interface surface 270 measured at the edge 272 of the top substrate 266. The bottom substrate 256 likewise has a thickness 276, which, in embodiments, is the distance between the interface surface 258 and the opposite surface 260 at the edge 262. In embodiments, the thicknesses 274, 276 of the top substrate 266 and the bottom substrate 256 are each between 100 µm and 300 µm (such as between 100 µm and 140 µm), while the thickness 252 of the intermediate substrate 204 is between 400 µm and 700 µm (such as between 400 µm and 600 µm).

In embodiments, step 254 (positioning the bottom substrate 256 adjacent to the intermediate substrate 204), step 278 (emitting bonding laser energy 214 onto bottom strip 242 until bottom strip 242 diffuses and forms the bottom bond 280), step 264 (positioning top substrate 266 over top surface 206 of the intermediate substrate 204), and step 286 (emitting bonding laser energy 214 onto top strip 226 until top strip 226 diffuses and forms the top bond 288) occur in that order relative to each other. In other embodiments, step 264 (positioning top substrate 266 adjacent top surface 206 of the intermediate substrate 204), step 286 (emitting bonding laser energy 214 onto top strip 226 until top strip 226 diffuses and forms the top bond 288), step 254 (positioning the bottom substrate 256 adjacent to the intermediate substrate 204), and step 278 (emitting bonding laser energy 214 onto bottom strip 242 until bottom strip 242 diffuses and forms the bottom bond 280) occur in that order relative to each other. In other embodiments, step 254 (positioning the bottom substrate 256 adjacent to the intermediate substrate 204) and step 264 (positioning top substrate 266 adjacent to the top surface 206 of the intermediate substrate 204) can be performed (in either order relative to each other) before step 278 (emitting bonding laser energy 214 onto bottom strip 242 until bottom strip 242 diffuses and forms the bottom bond 280) and step 286 (emitting bonding laser energy 214 onto top strip 226 until top strip 226 diffuses and forms the top bond 288).

In embodiments, steps 278, 286 occur during the same sequence of emitting the bonding laser energy 214 while the top substrate 266 is positioned over the intermediate substrate 204 and the intermediate substrate 204 is positioned over the bottom substrate 256. In these embodiments, the laser 34 emits the bonding laser energy 214, which transmits through the top substrate 266. The bonding laser energy 214 then impinges upon the top strip 226. The top strip 226 absorbs the energy from the bonding laser energy 214 and diffuses into both of the top substrate 266 and the intermediate substrate 204. This diffusion of the top strip 226 into the top substrate 266 and the intermediate substrate 204 creates the top bond 288 between the top substrate 266 and the intermediate substrate 204. The top bond 288 is at least essentially transparent to the wavelength of the bonding laser energy 214 as well. After the top bond 288 is formed, the bonding laser energy 214 is able to propagate from the laser 34, through the top substrate 266, through the top bond 288, through the intermediate substrate 204, and impinge upon the bottom strip 242. Like the top strip 226, the bottom strip 242 absorbs the bonding laser energy 214 and diffuses into both of the intermediate substrate 204 and the bottom substrate 256. This diffusion of the bottom strip 242 into the intermediate substrate 204 and the top substrate 266 creates the bottom bond 280 between the intermediate substrate 204 and the bottom substrate 256. The intermediate substrate 204, with the top substrate 266 positioned above and the bottom substrate 256 positioned below, is translated relative to the bonding laser energy 214 (or vice-versa) and the entireties of the top strip 226 and the bottom strip 242 are diffused to form the top bond 288 and the bottom bond 280, respectively. After diffusion of the top strip 226 and then subsequently the bottom strip 242, the bonding laser energy 214 propagates through the bottom bond 280 and then through the bottom substrate 256. As described above with the method 10, the combination of steps 278, 286 of the method 200 is self-regulating in that no further heating of the now bonded top substrate 266, intermediate substrate 204, and bottom substrate 256 takes place. The translation of the intermediate substrate 204, with the top substrate 266 positioned above and the bottom substrate 256 positioned below, can occur slowly enough so that the bonding laser energy 214 diffuses both the top strip 226 and the bottom strip 242 in the same pass of the bonding laser energy 214. Alternatively, the translation of the intermediate substrate 204, with the top substrate 266 positioned above and the bottom substrate 256 positioned below, can occur quickly enough so that the entirety of the top strip 226 is diffused to form the top bond 288 in a first pass of the bonding laser energy 214 and then the entirety of the bottom strip 242 is diffused to form the bottom bond 280 in a second pass with the bonding laser energy 214.

The bonding laser energy 214 causing the bottom strip 242 and the top strip 226 to diffuse and form the bottom bond 280 and the top bond 288, respectively, forms an array of liquid lenses 294 (FIG. 21). In the array of liquid lenses 294, the top bond 288 overlaps the bottom bond 280, meaning that the top bond 288 is spatially positioned over the bottom bond 280 when the opposite surface 260 faces downward, with the top bond 288 and the bottom bond 280 separated a portion of intermediate substrate 204. Each of the liquid lenses 202 of the array of liquid lenses 294 includes one of the plurality of through holes 210. More on the structure of embodiments of the liquid lens 202 of the array of liquid lenses 294 is set forth below. In embodiments, the array of liquid lenses 294 has an edge 296 around a perimeter of the array of liquid lenses 294, and the edge 296 is contiguous without interface between the incident surface 268 provided by the top substrate 266 and the opposite surface 260 provided by the bottom substrate 256. The edge 296 is without interface because the top bond 288 provides the contiguous transition from the top substrate 266 to the intermediate substrate 204, and the bottom bond 280 provides the contiguous transition from the intermediate substrate 204 to the bottom substrate 256.

Figure 22:
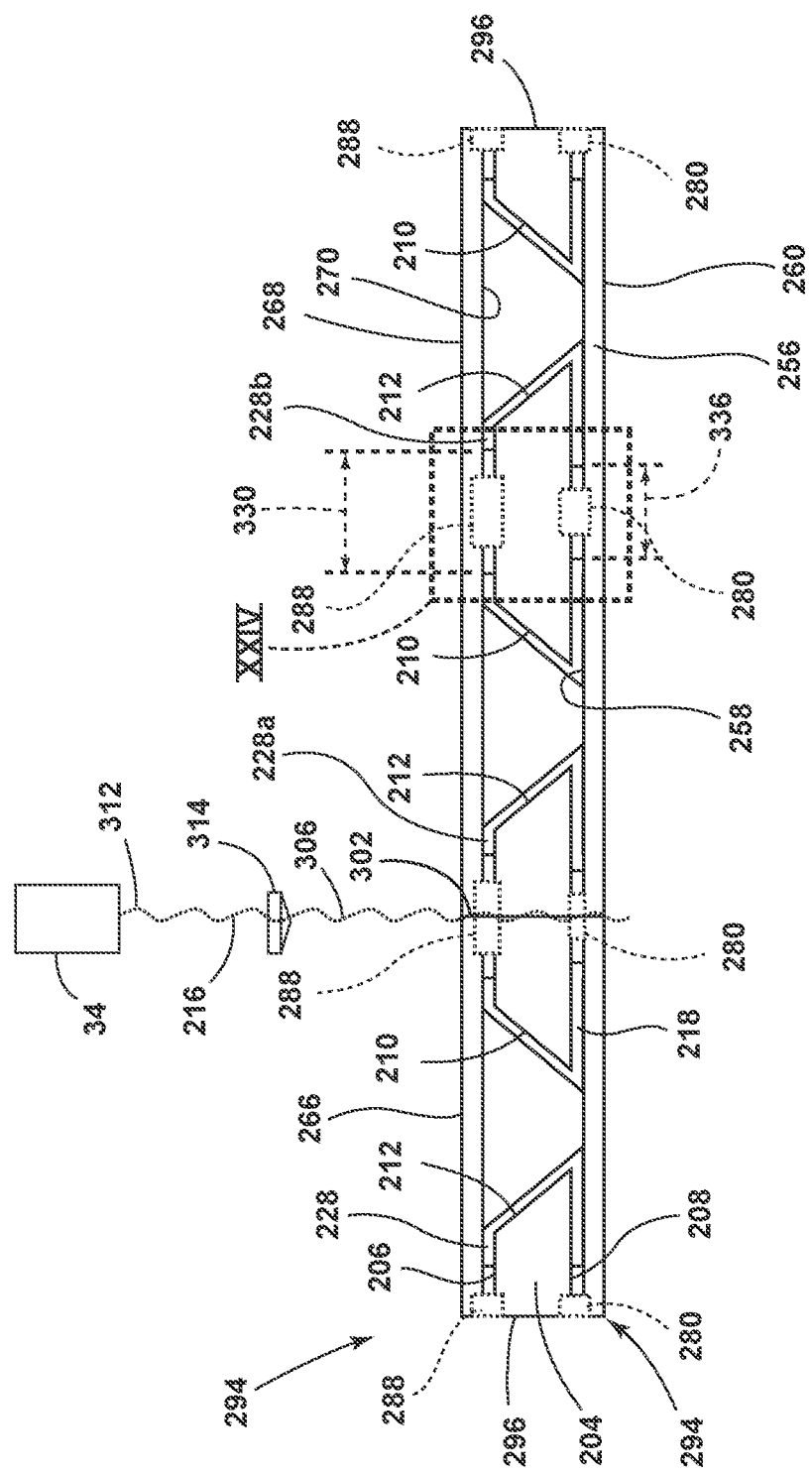
FIG. 22 is a cross-sectional view taken through line XXII-XXII of FIG. 21, illustrating the induced absorption laser energy having created a fault line vertically through the array of liquid lenses between two adjacent liquid lenses, and the fault line extends through the top substrate, the top bond, the intermediate substrate, the bottom bond, and the bottom substrate.
Figure 23:
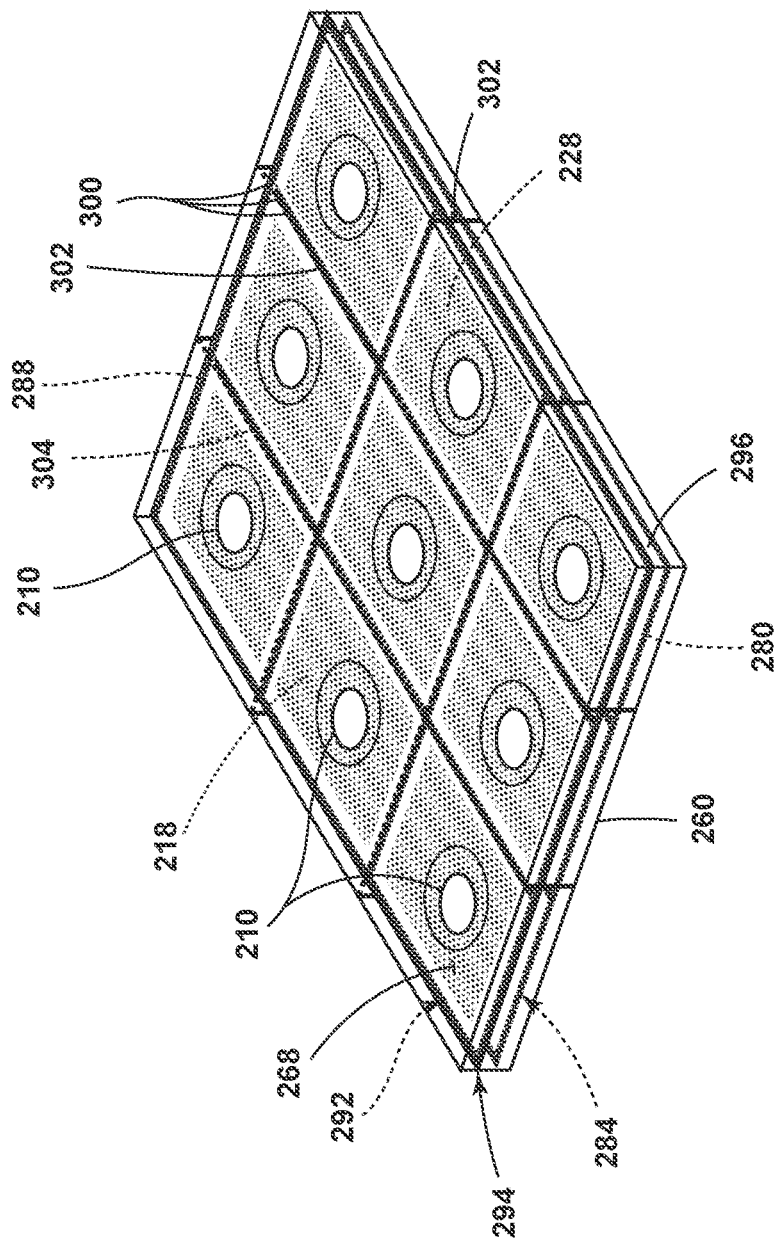
FIG. 23 is a perspective view of the array of liquid lenses after the induced absorption laser energy has created a series of fault lines forming a contour between each adjacent liquid lens in the array of liquid lenses.
Figure 24:
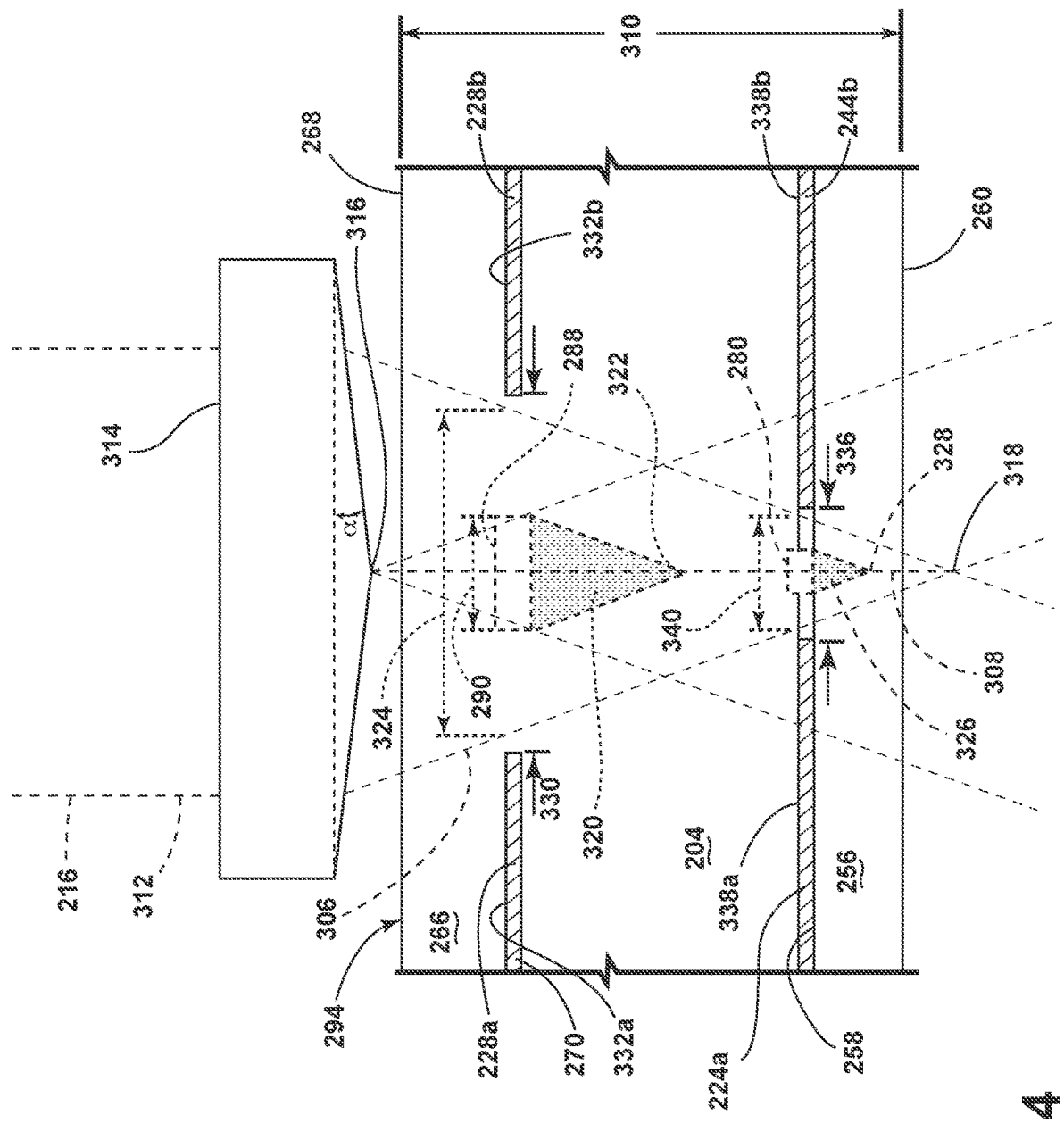
FIG. 24 is a conceptual view of area XXIV of FIG. 22 in a moment in time just prior to the induced absorption laser energy generating one of the fault lines through the array of liquid lenses, illustrating remaining regions of the conductive coating laterally adjacent to the top strip but separated by a distance that is larger than the diameter of an approximated Bessel beam profile of the induced absorption laser energy so as not to interfere with the formation of a focal line that refocuses from a refocusing point to the bottom bond, and remaining regions of the conductive coating laterally adjacent to the bottom strip but separated by a distance that is larger than the diameter of an approximated Bessel beam profile of the induced absorption laser energy so as not to interfere with the formation of a focal line that refocuses from a refocusing point to the opposite surface of the array of liquid lenses.

Referring now additionally to FIGS. 22-24, the method 200 further comprises, at step 298, emitting the induced absorption laser energy 216 (the second laser energy 52 of the method 10 above) through the array of liquid lenses 294 to create a series 300 of fault lines 302 through the top substrate 266, the top bond 288, the intermediate substrate 204, the bottom bond 280, and the bottom substrate 256. The series 300 of fault lines 302 form a contour 304 between adjacent liquid lenses 202 of the array of liquid lenses 294. The series 300 of fault lines 302 will allow for the separation of each liquid lens 202 from the array of liquid lenses 294 in a subsequent step. Note that the series 300 of fault lines 302 are not formed along the edge 296 of the array of liquid lenses 294, because there is no adjacent liquid lens 202 to separate from the array of liquid lenses 294 at the edge 296. The series 300 of fault lines 302 is akin to the series 82 of fault lines 54 described above, and the same discussion applies.

Like the second laser energy 52 of the method 10 above, the induced absorption laser energy 216 that generates each fault line 302 has an approximated Bessel beam 306 profile. The top substrate 266, the intermediate substrate 204, and the bottom substrate 256 are all at least essentially transparent to the wavelength of the induced absorption laser energy 216. The top bond 288 and the bottom bond 280 may be less transparent to the wavelength of the induced absorption laser energy 216.

The approximated Bessel beam 306 condenses the induced absorption laser energy 216 into a high aspect ratio focal line 308 (FIG. 24). The array of liquid lenses 294 has a thickness 310. The thickness 310 is the shortest straightline distance from the incident surface 268 to the opposite surface 260. In embodiments, the thickness 310 is less than 1.1 mm, 1.1 mm, or greater than 1.1 mm. The focal line 308 penetrates through the thickness 310 of the array of liquid lenses 294. The focal line 308, which is a volume of high energy density, creates each fault line 302 that extends from the incident surface 268 to the opposite surface 260 of the array of liquid lenses 294 via nonlinear effects, as described above.

Each fault line 302 in the series 300 created is vertically oriented, that is, extending into the top substrate 266 from the incident surface 268 at least approximately orthogonal to the incident surface 268 and then through the top substrate 266, through the top bond 288, through the intermediate substrate 204, through the bottom bond 280, and then through the bottom substrate 256. The series 300 of fault lines 302 delineate the desired shape and establishes a path of least resistance for crack propagation and hence separation along the contour 304, as will be discussed further below.

In embodiments, the laser 34 generates the induced absorption laser energy 216 with a Gaussian laser beam profile 312 and then propagates through an axicon lens 314, which in turn manipulates the induced absorption laser energy 216 to have the approximated Bessel beam 306 profile. The length of the focal line 308 extends from a convergence point 316 to a divergence point 318, which encompasses the thickness 310 of the array of liquid lenses 294. As described above with the method 10, other lenses can manipulate the Gaussian laser beam profile 312 to have a shorter focal line 308 (from the convergence point 316 to the divergence point 318) more suitable to the thickness 310 of the array of liquid lenses 294, if desired. The incident surface 268 of the array of liquid lenses 294 is aligned perpendicular to the focal line 308.

As mentioned above, the intensity of the induced absorption laser energy 216 away from the focal line 308 is insufficiently intense to cause multiphoton absorption and thus fails to create additional defects in the array of liquid lenses 294 other than the fault line 302. Similarly, the top bond 288 and the bottom bond 280, being less transparent to the induced absorption laser energy 216 than the top substrate 266, the intermediate substrate 204, and the bottom substrate 256, disrupts the induced absorption laser energy 216 in a top disruption zone 320 that extends from the top bond 288 toward the opposite surface 260 to a refocusing point 322 within the intermediate substrate 204. Within this top disruption zone 320, the focal line 308 is distorted and is less intense. In other words, the top bond 288 creates an optical distortion to the induced absorption laser energy 216, which degrades the quality of the focal line 308. If the top disruption zone 320 is not accounted for, then the non-disrupted, highly focused, focal line 308 may not be created within any of the thickness 310 of the array of liquid lenses 294 between the top bond 288 and the bottom bond 280. If the top disruption zone 320 is not accounted for, then the non-disrupted, highly focused, focal line 308 may not be created within any of the thickness 310 of the array of liquid lenses 294 from the top bond 288 to the opposite surface 260. If the top disruption zone 320 is not accounted for, the non-disrupted, highly focused, focal line 308 might extend only from the incident surface 268 through the top substrate 266 to the top bond 288, which will hinder fracture and separation of the liquid lens 202 from the array of liquid lenses 294 as discussed below.

To account for the top disruption zone 320, the approximated Bessel beam 306 incident upon the top bond 288 is configured to have a diameter 324 that is greater than the width 290 of the top bond 288. The approximated Bessel beam 306 having the diameter 324 that is greater (wider) than the width 290 of the top bond 288 minimizes the size of the top disruption zone 320 (i.e., how far the top disruption zone 320 extends towards the opposite surface 260) and the adverse effect on focal line 308 and thus fault line 302 generation that the top bond 288 causes. Because the diameter 324 of the approximated Bessel beam 306 incident upon the top bond 288 is wider than the top bond 288, the approximated Bessel beam 306 is able to fully refocus into the non, disrupted, highly focused focal line 308 within the intermediate substrate 204 at the refocusing point 322 before the bottom bond 280. Refocusing of the focal line 308 between the refocusing point 322 and the bottom bond 280 includes a portion of the thickness 252 of the intermediate substrate 204. Accordingly, the approximated Bessel beam 306 is fully focused into the focal line 308 from point 316 and through a portion of the thickness 274 of the top substrate 266 from the incident surface 268 to the top bond 288, and through a portion of the thickness 252 of the intermediate substrate 204 from the refocusing point 322 to the bottom bond 280. The wider the approximated Bessel beam 306 incident upon the top bond 288 relative to the width 290 of the top bond 288, the shorter the length of the top disruption zone 320 from the top bond 288 to the refocusing point 322 and thus the longer the refocused portion of the focal line 308 between the refocusing point 322 and the bottom bond 280 within the thickness 252 of the intermediate substrate 204. The longer the refocused portion of the focal line 308 between the refocusing point 322 and the bottom bond 280, the greater the quality of the fault line 302 through the array of liquid lenses 294, including through the top bond 288 and the top disruption zone 320, that the induced absorption laser energy 216 creates.

Even when the top disruption zone 320 is accounted for in the above manner, and the focal line 308 is caused to refocus at the refocusing point 322 in the intermediate substrate 204, the bottom bond 280 generates a bottom disruption zone 326, where the focal line 308 is again distorted and less intense. In other words, the bottom bond 280 creates an optical distortion to the induced absorption laser energy 216, which degrades the quality of the focal line 308. If the bottom disruption zone 326 is not accounted for, then the non-disrupted, highly focused, focal line 308 may not be created within any of the thickness 276 of the bottom substrate 256 between the bottom bond 280 and the opposite surface 260. This will hinder fracture and separation of the array of liquid lenses 294, especially through the bottom substrate 256.

In embodiments, to account for the bottom disruption zone 326, the width 282 of the bottom bond 280 is narrower than the width 290 of the top bond 288—that is, the width 290 of the top bond 288 is wider than the width 282 of the bottom bond 280. Because the diameter 324 of the approximated Bessel beam 306 incident on the top bond 288 is wider than the width 290 of the top bond 288, and the bottom bond 280 is narrower than the top bond 288, the focal line 308 can refocus at a refocusing point 328 within the bottom substrate 256 between the bottom bond 280 and the opposite surface 260. The width 282 of the bottom bond 280 being narrower than the width 290 of the top bond 288 minimizes the size of the bottom disruption zone 326 (i.e., how far the bottom disruption zone 326 extends towards the opposite surface 260) and the adverse effect on the focal line 308 and thus the fault line 302 generation that the bottom bond 280 causes. Because the width 282 of the bottom bond 280 is narrower than the width 290 of the top bond 288, the approximated Bessel beam 306 is able to fully refocus into the non-disrupted, highly focused focal line 308 within the bottom substrate 256 at the refocusing point 328 and the highly focused focal line 308 extends from the refocusing point 328 to the divergence point 318. Refocusing of the focal line 308 between the refocusing point 328 and the divergence point 318 includes a portion of the thickness 276 of the bottom substrate 256 between the refocusing point 328 and the opposite surface 260.

Accordingly, in embodiments, the approximated Bessel beam 306 is fully focused into the focal line 308 from the convergence point 316, through a portion of the thickness 274 of the top substrate 266 from the incident surface 268 to the top bond 288, through the thickness 252 of the intermediate substrate 204 from the refocusing point 322 to the bottom bond 280, and through a portion of the thickness 276 of the bottom substrate 256 from the refocusing point 328 to the opposite surface 260. The larger the diameter 324 of the approximated Bessel beam 306 incident upon the top bond 288 relative to the width 290 of the top bond 288, the longer the refocused portion of the focal line 308 between the refocusing point 322 and the bottom bond 280 within the intermediate substrate 204 (i.e., the shorter the top disruption zone 320), and the longer the refocused portion of the focal line 308 between the refocusing point 328 and the opposite surface 260 within the bottom substrate 256 (i.e., the shorter the bottom disruption zone 326). The longer the refocused portion of the focal line 308 between the refocusing point 322 and the bottom bond 280, and between the refocusing point 328 and the opposite surface 260, the greater the quality of the fault line 302 through the array of liquid lenses 294, including through the top bond 288, the top disruption zone 320, the bottom bond 280, and the bottom disruption zone 326 that the induced absorption laser energy 216 creates.

Although the diameter 324 of the approximated Bessel beam 306 incident on the top bond 288 ideally is wider than the width 290 of the top bond 288, the top portions 224 and the bottom portions 240 of the conductive coating 218 removed from the top surface 206 and the bottom surface 208, respectively, of the intermediate substrate 204 during steps 220, 238 by the ablating laser energy 222 (or some other removal method) are ideally minimized. The top regions 228 and the bottom regions 244 of conductive coating 218 remaining on the top surface 206 and the bottom surface 208 of the intermediate substrate 204, respectively, after formation of the top strip 226 and the bottom strip 242 can be maximized to maintain the functionality of the conductive coating 218 for each liquid lens 202 of the array of liquid lenses 294. The top region 228a and the top region 228b, for example, are separated by a distance 330, with the top bond 288 disposed between. For neither the top region 228a nor the top region 228b to interfere with generation of the focal line 308 extending from the refocusing point 322 to the bottom bond 280, the distance 330 between the top region 228a and the top region 228b can be at least larger than the diameter 324 of the approximated Bessel beam 306 that intersects with an incident plane defined by the top region 228a and the top region 228b. The incident plane is an imaginary plane extending from the plane provided by a surface 332a of the top region 228a closest to the incident surface 268 to the plane provided by a surface 332b of the top region 228b closest to the incident surface 268. If the top regions 228a, 228b are equidistant from a center of the top bond 288 and the focal line 308 is centered through the top bond 288, and if the distance 330 between the top regions 228a, 228b is at least larger than the diameter 324 of the approximated Bessel beam 306, then neither of the top regions 228a, 228b of the conductive coating 218 will interfere with the approximated Bessel beam 306 formation of the focal line 308 between the refocusing point 322 and the bottom bond 280. In any other scenario, the distance 330 can be larger. In embodiments, the distance 330 is 1% larger than the diameter 324. In other embodiments, the distance 330 is 5%, or 10%, or 15%, or between 1% and 5%, or between 1% and 10%, or between 1% and 15% larger than the diameter 324. In embodiments, the distance 330 is between 200 µm and 300 µm. Because the removed top portions 224 of the conductive coating 218 between the top substrate 266 and the intermediate substrate 204 are ablated in step 220 with the ablative laser energy 222, the distance 330 between the top regions 228a, 228b of the conductive coating 218 remaining, and the equidistance from the subsequent top bond 288, can be controlled and minimized so as to maximize the top regions 228a, 228b remaining without interfering with the approximated Bessel beam 306 formation of the focal line 308. In some embodiments, the approximated Bessel beam 306 has a diameter at the incident surface 268 of the array of liquid lenses 294 that is greater than the distance 330 between the top regions 228a, 228b of the conductive coating 218 remaining between the top substrate 266 and the intermediate substrate 204.

Similarly, as described above, after emitting the ablating laser energy 222 onto the conductive coating 218 disposed at the bottom surface 208 of the intermediate substrate 204 to remove bottom portions 240 of the conductive coating 218 and thus form the bottom strip 242 of the conductive coating 218 at the bottom surface 208, the bottom regions 244a, 244b of the conductive coating 218 remain. The bottom regions 244a, 244b are separated by a distance 336, with the bottom bond 280 disposed between. For neither of the bottom regions 244a, 244b to interfere with the refocusing of the focal line 308 extending from refocusing point 328 through the opposite surface 260, the distance 336 between the bottom regions 244a, 244b can be at least larger than a diameter 340 of the approximated Bessel beam 306 that intersects with an incident plane defined by the bottom regions 244a, 244b. The incident plane is an imaginary plane extending from the plane provided by a surface 338a of the bottom region 244a closest to the incident surface 268 to the plane provided by a surface 338b of the bottom region 244b closest to the incident surface 268. If the bottom regions 244a, 244b are equidistant from a center of the bottom bond 280 and the focal line 308 is centered through the bottom bond 280, and if the distance 336 between the bottom regions 244a, 244b is at least larger than the diameter 340 of the approximated Bessel beam 306 incident upon the incident plane, then neither of the bottom regions 244a, 244b of the conductive coating 218 will interfere with the approximated Bessel beam 306 formation of the focal line 308 between the refocusing point 328 and the opposite surface 260. In any other scenario, the distance 336 can be larger. In embodiments, the distance 336 is 1% larger than the diameter 340. In other embodiments, the distance 336 is 5%, or 10%, or 15%, or between 1% and 5%, or between 1% and 10%, or between 1% and 15% larger than the diameter 340. Because the removed bottom portions 240 of the conductive coating 218 between the bottom substrate 256 and the intermediate substrate 204 are ablated in step 238 with the ablative laser energy 222, the distance 336 between the bottom regions 244a, 244b of the conductive coating 218 remaining, and the equidistance from the subsequent bottom bond 280, can be controlled and minimized so as to maximize the bottom regions 244a, 244b remaining without interfering with the approximated Bessel beam 306 formation of the focal line 308. In some embodiments, the distance 336 between the bottom regions 244a, 244b is shorter than the distance 330 between the top regions 228a, 228b that are disposed between the top substrate 266 and the intermediate substrate 204.

Figure 25:
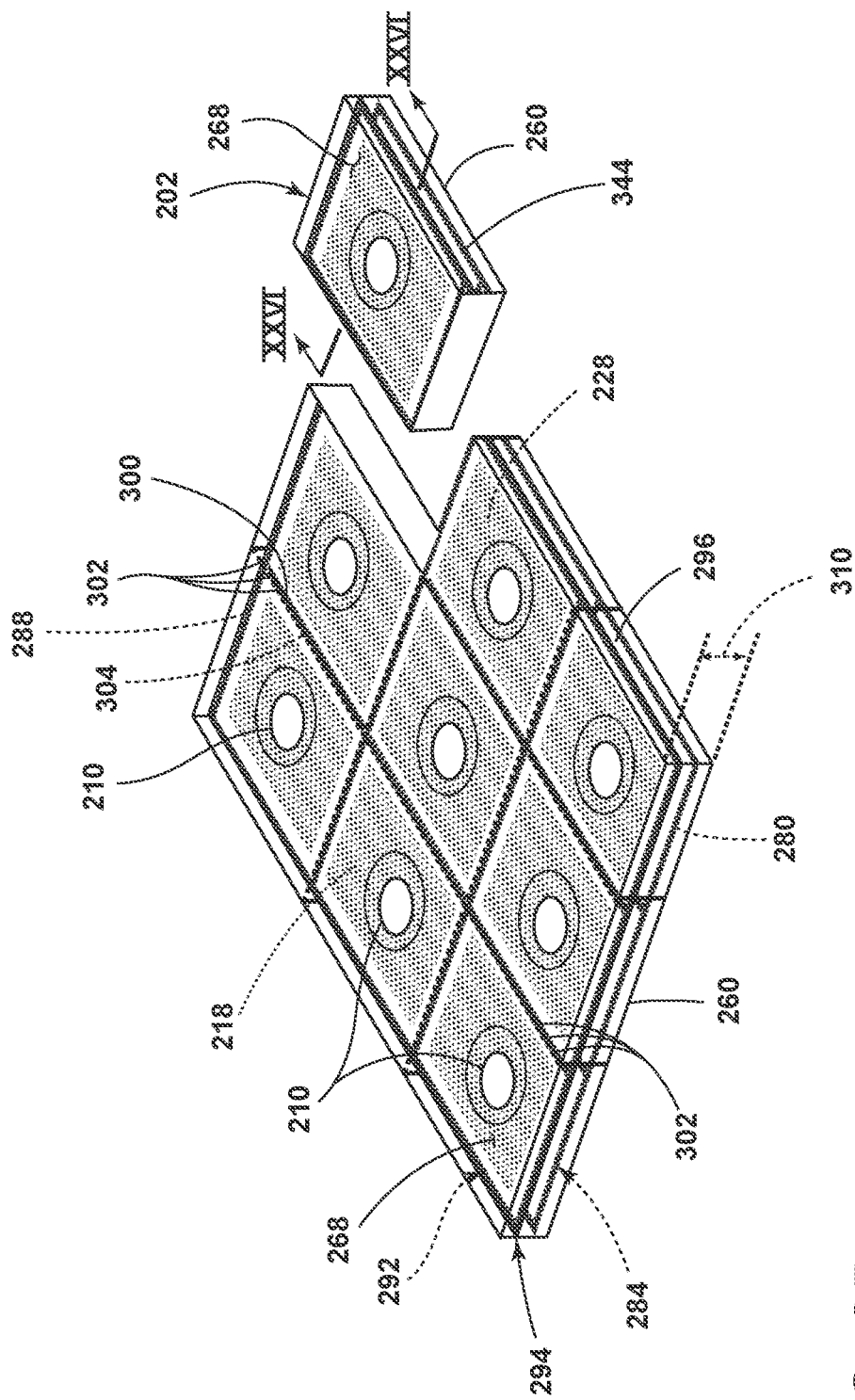
FIG. 25 is a perspective view of a liquid lens having been separated from the array of lenses according to another step of the method of FIG. 12, illustrating that the liquid lens was separated from the array of liquid lenses along the contour between adjacent liquid lenses formed by the series of fault lines.

Referring now additionally to FIG. 25, the method 200 further comprises, at step 342, separating the liquid lens 202 from the array of liquid lenses 294 along the contour 304. Each liquid lens 202 of the array of liquid lenses 294 are separated to form a plurality of liquid lenses 202. Once the series 300 of fault lines 302 is formed into the contour 304, if the array of liquid lenses 294 has sufficient internal stress, cracks will propagate along the contour 304 and the array of liquid lenses 294 will separate into a plurality of liquid lenses 202. In such a circumstance, no secondary separation processes, such as tension/bending forces or thermal stress created, for example, by a $CO_2$ laser, are necessary.

However, if the array of liquid lenses 294 lacks sufficient internal stress to initiate cracks along the contour 304, separating the liquid lens 202 from the array of liquid lenses 294 along the contour 304 can include applying mechanical or thermal stress on or around the contour 304, as described above in connection with the method 10. The method 200 allowing for the production of many liquid lenses 202 essentially simultaneously in the same production run as an array of liquid lenses is an improvement over other methods that manufacture only one liquid lens at a time.

Figure 26:
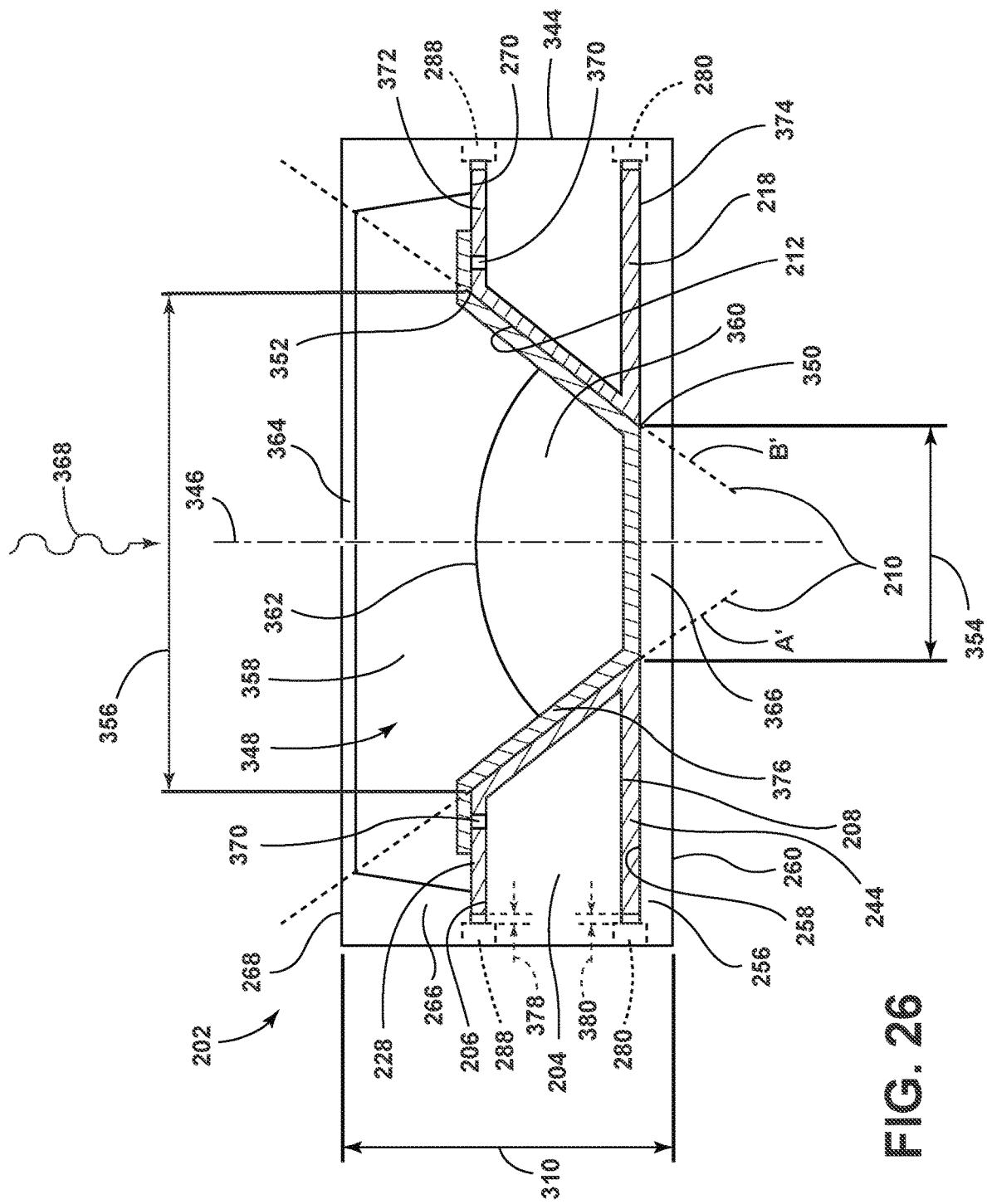
FIG. 26 is a cross-sectional view taken through line XXVI-XXVI of FIG. 25, illustrating the liquid lens that was separated from the array of liquid lenses includes a cavity that contains a first liquid and a second liquid, and that the top bond and the bottom bond form a contiguous seal along the edges.

Referring now additionally to FIG. 26, after the separation, each liquid lens 202 includes the top substrate 266, the intermediate substrate 204, and the bottom substrate 256. In embodiments, adjacent liquid lenses 202 that shared a common top bond 288 and a common bottom bond 280 while part of the array of liquid lenses 294, after separation into individual liquid lenses 202, each include approximately half of the width 290 of the common top bond 288 and half of the width 282 of the common bottom bond 280. For example, in those embodiments, if the width 290 of the top bond 288 of the array of liquid lenses 294 was 10 µm before the step 342, then each separated liquid lens 202 after step 342 is approximately 5 µm.

The liquid lens 202 has one or more edges 344. The edges 344 form a perimeter around the liquid lens 202. In embodiments, the edges 344 are at least approximately orthogonal to the incident surface 268 and the opposite surface 260. Along each edge 344, the top bond 288 between the top substrate 266 and the intermediate substrate 204, and the bottom bond 280 between the intermediate substrate 204 and the bottom substrate 256, are part of the edge 344, along with the top substrate 266 and the bottom substrate 256. The top bond 288 and the bottom bond 280 are contiguous around the perimeter of each liquid lens 202 separated from the array of liquid lenses 294. In other words, each liquid lens 202 is hermetically sealed by the top bond 288 and the bottom bond 280 that extends along every edge 344 around the perimeter of the liquid lens 202. The top bond 288 seals the interface between the top substrate 266 and the intermediate substrate 204. The bottom bond 280 seals the interface between the intermediate substrate 204 and the bottom substrate 256. Each liquid lens 202 adopts the thickness 310 of the array of liquid lenses 294. Each liquid lens 202 of the plurality of liquid lenses 294 separated from the array of liquid lenses 294 has the same general structure as herein described for the liquid lens 202. The method 200 thus provides a liquid lens 202 that is sealed along the edge 344 that is more mechanically robust than other manufacturing methods that seal the liquid lens 202 along the edge 344 with adhesives. The combination of the steps 278, 286, 298 of the method 200, where fast laser processes are utilized to form a bond around the perimeter of each liquid lens 202 of the array of liquid lenses 294 and then separate the liquid lenses 202 through the bond, is an improvement over other methods.

In embodiments:
(1) the axicon lens 314 is positioned relative to the array of liquid lenses 294 so that:
  (a) the focal line 308 is centered through the top bond 288 and the bottom bond 280,
  (b) the focal line 308 extends through the top substrate 266 from the incident surface 268 to the top bond 288,
  (c) the focal line 308 extends a distance from the refocusing point 322 after the top disruption zone 320 to the bottom bond 280 that is at least 40 percent of the thickness 252 of the intermediate substrate 204, and
  (d) the focal line 308 extends a distance from the refocusing point 328 after the bottom disruption zone 326 to the opposite surface 260 that is at least 40 percent of the thickness of the bottom substrate 256;
(2) the top regions 228a, 228b of the conductive coating 218 remaining between the top substrate 266 and the intermediate substrate 204 is separated by the distance 330 that is larger than the diameter 324 of the approximated Bessel beam 306 but less than 10 percent larger than the diameter 324; and
(3) the bottom regions 244a, 244b of the conductive coating 218 remaining between the bottom substrate 256 and the intermediate substrate 204 is separated by the distance 336 that is larger than the diameter 324 of the approximated Bessel beam 306 but less than 10 percent larger than the diameter 324.

In other embodiments, (2) the top regions 228a, 228b of conductive coating 218 remaining between the top substrate 266 and the intermediate substrate 204 is separated by the distance 330 that is larger than the diameter 324 of the approximated Bessel beam 306 but less than 5 percent larger than the diameter 324; and (3) the bottom regions 244a, 244b of conductive coating 218 remaining between the top substrate 266 and the intermediate substrate 204 is separated by the distance 330 that is larger than the diameter 324 of the approximated Bessel beam 306 but less than 5 percent larger than the diameter 324.

In other embodiments, (1)(c) the focal line 308 extends a distance from the refocusing point 322 after the top disruption zone 320 to the bottom bond 280 that is at least 50 percent of the thickness 252 of the intermediate substrate 204; and (1)(d) the focal line 308 extends a distance from the refocusing point 328 after the bottom disruption zone 326 to the opposite surface 260 that is at least 50 percent of the thickness of the bottom substrate 256.

Such embodiments provide a balance between: (A) having the focal line 308 extend through a thickness of both the intermediate substrate 204 and the bottom substrate 256 that is sufficient to generate the fault lines 302 of sufficient quality to cause or to allow separation pursuant to subsequent steps of the method 200; and (B) maximizing the amount of conductive coating 218 remaining between the top substrate 266 and the intermediate substrate 204, and the bottom substrate 256 and the intermediate substrate 204, to provide sufficient functionality for the purposes of the liquid lenses 202. Such a balance allows for large scale manufacturing of liquid lenses 202 using fast laser oriented processes described above to create a robust hermetic seal along the edges 344 of each liquid lens 202 that is still present after separation from the array of liquid lenses 294 via another fast laser oriented separation process.

In some embodiments, the liquid lens 202 has an optical axis 346. The optical axis 346 is generally parallel to the fault line 302 generated during step 298 to create the contour 304. The optical axis 346 extends through the through hole 210, which is further denoted in FIG. 26 by dotted lines A' and B'. The through hole 210 is rotationally symmetric about the optical axis 346, and can take a variety of shapes, for example, as set forth in U.S. Pat. No. 8,922,901, which is hereby incorporated by reference in its entirety. The top substrate 266, the bottom substrate 256, and the through hole 210 of the intermediate substrate 204 define a cavity 348. In other words, the cavity 348 is disposed between the top substrate 266 and the bottom substrate 256, and within the through hole 210 of the intermediate substrate 204. In embodiments, the through hole 210 has a narrow opening 350 and a wide opening 352. The terms "narrow opening" and "wide opening" are relative terms to denote size of the openings 350, 352 respective to each other. The narrow opening 350 has a diameter 354. The wide opening 352 has a diameter 356. In some embodiments, the diameter 356 of the wide opening 352 is greater than the diameter 354 of the narrow opening 350.

The liquid lens 202 further includes a first liquid 358 and a second liquid 360 disposed within the cavity 348. The first liquid 358 and the second liquid 360 are substantially non-miscible or non-miscible. Therefore, the first liquid 358 and the second liquid 360 are separated at an interface 362. The first liquid 358 is a polar liquid or a conducting liquid. The second liquid 360 is a non-polar liquid or an insulating liquid. The first liquid 358 has a different refractive index than the second liquid 360, such that the interface 362 between the first liquid 358 and the second liquid 360 forms a lens. In embodiments, the first liquid 358 and the second liquid 360 have substantially the same density, which can help to avoid changes in the shape of the interface 362 as a result of changing the physical orientation of the liquid lens 202 (e.g., as a result of gravitational forces). The top bond 288 and the bottom bond 280 along the edges 344 around the perimeter of the liquid lens 202, which were generated via steps of the method 200 above, hermetically seal the first liquid 358 and the second liquid 360 within the cavity 348 of the liquid lens 202. In embodiments, the first liquid 358 and the second liquid 360 are added to the through holes 210 after the intermediate substrate 204 and the bottom substrate 256 become bonded in step 278 but before the top substrate 266 is placed over the bonded intermediate substrate 204 and bottom substrate 256 in step 264.

The liquid lens 202 further includes a first window 364 and a second window 366. The top substrate 266 provides the first window 364. The bottom substrate 256 provides the second window 366. For example, a portion of the top substrate 266 covering the cavity 348 serves as the first window 364, and a portion of the bottom substrate 256 covering the cavity 348 serves as the second window 366. In embodiments, electromagnetic radiation 368 having one or more wavelengths relevant to the application of the liquid lens 202 enters the liquid lens 202 through the first window 364, is refracted at the interface 362 between the first liquid 358 and the second liquid 360, and exits the liquid lens 202 through the second window 366. In embodiments, the electromagnetic radiation 368 has wavelengths in the visible spectrum. The electromagnetic radiation 368 exiting the liquid lens 202 through the second window 366 typically proceeds to a sensor, such as an image sensor when the relevant wavelengths for the electromagnetic radiation 368 are within the visible spectrum.

The top substrate 266 and the bottom substrate 256 have sufficient transparency to enable passage of the electromagnetic radiation 368 of the relevant wavelengths through the liquid lens 202. In embodiments, the top substrate 266 and the bottom substrate 256 each comprise a polymeric, a glass, ceramic, or glass-ceramic material. Because electromagnetic radiation 368 of the relevant wavelengths can pass through the through hole 210 in the intermediate substrate 204, the intermediate substrate 204 need not be transparent to the electromagnetic radiation 368. However, the intermediate substrate 204 can be transparent to the electromagnetic radiation 368 at issue.

As mentioned, the incident surface 268 and the opposite surface 260, as in the illustrated embodiment, can be substantially planar. Thus, although the liquid lens 202 can function as a lens (e.g., by refracting electromagnetic radiation of the relevant wavelength(s) passing through the interface), the incident surface 268 and the opposite surface 260 of the liquid lens 202 can be flat as opposed to being curved like outer surfaces of a fixed lens. In other embodiments, the incident surface 268 and the opposite surface 260 where the first window 364 and the second window 366, respectively, are provided can be curved (e.g., concave or convex), thus providing an integrated fixed lens.

The liquid lens 202 includes the top region 228 of conductive coating 218 remaining after step 220, as described above. During the step 220 using the ablating laser energy 222, the ablating laser energy 222 can further ablate a scribe 370 near the through hole 210 to reveal the top surface 206 of the intermediate substrate 204 and to separate the conductive coating 218 into a first conductive layer 372 and a second conductive layer 374. The first conductive layer 372 is disposed between the top substrate 266 and the intermediate substrate 204. The second conductive layer 374 is disposed between the intermediate substrate 204 and the bottom substrate 256 and extends onto the through hole 210 over the intermediate substrate 204. The scribe 370 forms, and electrically isolates from each other, the first conductive layer 372 and the second conductive layer 374.

In embodiments, the conductive coating 218, and thus the first conductive layer 372 and the second conductive layer 374, are metal or comprise metal. The first conductive layer 372 and the second conductive layer 374 can include one or more of the metals, and/or oxides thereof, of Groups 4, 5, 6, 11, 13, and 14 of the Periodic Table, including mixed metal oxides. Example metals include gold, chromium, titanium, nickel, and/or copper including oxides thereof. Other materials for the first conductive layer 372 and the second conductive layer 374 can include a conductive polymer material, another suitable conductive material, or a combination thereof. Either of or both of the first conductive layer 372 and the second conductive layer 374 can comprise a single layer or a plurality of layers, some or all of which can be conductive. The first conductive layer 372 functions as a common electrode in electrical communication with the first liquid 358. The second conductive layer 374 functions as a driving electrode. The second conductive layer 374 is disposed on the through hole 210 as well as between the intermediate substrate 204 and the bottom substrate 256.

The second conductive layer 374 is insulated from the first liquid 358 and the second liquid 360, via an insulating layer 376. The insulating layer 376 can be added to each liquid lens 202 of the array of liquid lenses 294 after step 254 of the method 200 above where the intermediate substrate 204 is positioned adjacent to (such as over) the bottom substrate 256. The insulating layer 376 can comprise an insulating coating applied to the second conductive layer 374 and the second window 366 after bonding the bottom substrate 256 to the intermediate substrate 204 and before bonding the top substrate 266 to the intermediate substrate 204 in step 264. Thus, the insulating layer 376 covers at least a portion of the second conductive layer 374 within the cavity 348 and the second window 366. The insulating layer 376 can be sufficiently transparent to enable passage of the wavelength(s) of electromagnetic radiation 368 at issue through the second window 366 as described herein. The insulating layer 376 can cover at least a portion of the second conductive layer 374 (acting as the driving electrode) (e.g., the portion of the second conductive layer 374 disposed within the cavity 348) to insulate the first liquid 358 and the second liquid 360 from the second conductive layer 374. The insulating layer 376 does not cover at least a portion of the first conductive layer 372 (acting as the common electrode) disposed within the cavity 348 (i.e., the insulating layer 376 can cover a portion of the first conductive layer 372 within the cavity 348, while another portion of the first conductive layer 372 remains uncovered). Thus, the first conductive layer 372 can be in electrical communication with the first liquid 358. Masking can be used to restrict the coverage of the insulating layer 376 to the aforementioned components within the cavity 348.

In embodiments, the liquid lens 202 further includes one or more apertures (not illustrated) through the top substrate 266 and one or more apertures (not illustrated) through the bottom substrate 256 to allow for electrical communication with the first conductive layer 372 and the second conductive layer 374. More specifically, the apertures serve as contacts to enable electrical connection of the liquid lens 202 to a controller, a driver, or another component of a lens or electromagnetic radiation sensing system. In other words, the apertures provide an electrical contact point between the liquid lens 202 and another electrical device. As known in the art, the shape of the interface 362 can be altered by varying the voltage differential applied to the first conductive layer 372 and the second conductive layer 374. Varying the voltage changes the contact angle of the first liquid 358 to the insulating layer 376 over the intermediate substrate 204. Changing the contact angle of the first liquid 358 changes the shape and/or position of the interface 362, which change the effect of the refraction of the electromagnetic radiation 368 propagating through the interface 362.

It will be apparent to those skilled in the art that various modifications and variations can be made without departing from the spirit or scope of the claims.

What is claimed is:

1. A method of forming a bond between substrates and manipulating the bond, the method comprising:
    emitting a first laser energy onto a length and a width of a strip of an absorption material disposed between a first substrate and a second substrate until the strip of the absorption material diffuses into the first substrate and the second substrate resulting in a bond between the first substrate and the second substrate, thereby creating a workpiece comprising the first substrate bonded to the second substrate through the bond, the bond having a length and a width at least approximating the length and the width of the strip before the strip is diffused;
    emitting a second laser energy through the workpiece at the bond to create a fault line through the first substrate and the second substrate, the second laser energy provided by an approximated Bessel beam, the approximated Bessel beam incident upon the bond having a diameter that is greater than the width of the bond; and repeating emitting the second laser energy step along the length of the bond to create a series of fault lines forming a contour.

2. The method of claim 1 wherein:
the bond is not essentially transparent to the second laser energy.

3. The method of claim 1 further comprising:
separating a first portion of the workpiece from a second portion of the workpiece along the contour.

4. The method of claim 3, wherein:
separating the first portion of the workpiece from the second portion of the workpiece along the contour comprises applying mechanical or thermal stress on or around the contour.

5. The method of claim 3, wherein:
the first portion comprises one or more edges; and
at least one of the one or more edges comprises at least a portion of the bond between the first substrate and the second substrate.

6. The method of claim 3, wherein:
each of the first portion and the second portion comprises the first substrate, the second substrate, and a portion of the width of the bond.

7. The method of claim 3, wherein:
the bond is contiguous around a perimeter of the first portion.

8. The method of claim 1 further comprising:
emitting a third laser energy onto a layer of the absorption material disposed on either of the first substrate or the second substrate to remove a portion of the absorption material from the first substrate or the second substrate to form the strip of the absorption material.

9. The method of claim 8, wherein:
after the strip of the absorption material is formed, a first portion of the layer of the absorption material remains disposed between the first substrate and the second substrate lateral to the strip, and a second portion of the layer of the absorption material remains disposed between the first substrate and the second substrate lateral to the strip.

10. The method of claim 9, wherein:
the first portion of the layer of the absorption material and the second portion of the layer of the absorption material do not interfere with the approximated Bessel beam.

11. The method of claim 9, wherein:
the first portion of the layer of the absorption material and the second portion of the layer of the absorption material are separated by a distance; and
the distance is greater than the diameter of the approximated Bessel beam that intersects with an incident plane defined by the first portion and the second portion, such that the first portion and the second portion do not interfere with the second laser energy creating the fault line during the emitting the second laser energy step.

12. The method of claim 1, wherein:
the first substrate and the second substrate are glass substrates.

13. The method of claim 1, wherein:
the first laser energy penetrates through either the first substrate or the second substrate before interacting with the strip of the absorption material to cause the absorption material to diffuse;

whichever of the first substrate or the second substrate through which the first laser energy penetrates before interacting with the strip of the absorption material is at least essentially transparent to a wavelength of the first laser energy; and the absorption material is essentially opaque to the wavelength of the first laser energy.

14. The method of claim 13, wherein:
both the first substrate and the second substrate are at least essentially transparent to the wavelength of the first laser energy.

15. The method of claim 1, wherein:
the absorption material comprises a metal, a semiconductor, or a ceramic.

16. The method of claim 1, wherein:
the strip of the absorption material has a thickness of at least 1 nm.

17. The method of claim 1, wherein:
the first laser energy is provided by a Gaussian laser beam.

18. The method of claim 1, wherein:
the width of the strip is between 5 $\mu$m and 350 $\mu$m.

19. The method of claim 1, wherein:
the fault lines in the series of fault lines are separated by a distance of between 0.1 $\mu$m and 20 $\mu$m.

20. The method of claim 1, wherein:
the second laser energy has a wavelength of any of 266 nm, 355 nm, 532 nm, or 1064 nm.

21. The method of claim 1, wherein:
the second laser energy is provided in a pulse duration of 100 psec or less.

22. The method of claim 1, wherein:
the approximated Bessel beam is generated by emitting the second laser energy in the form of a Gaussian laser beam and then manipulating the Gaussian laser beam with an axicon lens.

23. The method of claim 1 further comprising:
emitting a third laser energy onto a layer of the absorption material disposed between the first substrate and the second substrate to remove a portion of the absorption material to form the strip of the absorption material;

wherein, after the strip of the absorption material is formed, a first portion of the layer of the absorption material remains disposed between the first substrate and the second substrate lateral to the strip, and a second portion of the layer of the absorption material remains disposed between the first substrate and the second substrate lateral to the strip;

wherein, the first portion of the layer of the absorption material and the second portion of the layer of the absorption material are separated by a distance; and wherein, the approximated Bessel beam has a diameter at an incident surface of the workpiece that is greater than the distance between the first portion of the layer of the absorption material and the second portion of the layer of the absorption material, such that the first portion and the second portion do not interfere with the second laser energy creating the fault line during the emitting the second laser energy step.

24. The method of claim 23 further comprising:
separating a first portion of the workpiece from a second portion of the workpiece along the contour;
wherein, the workpiece is an array of liquid lenses, and the first portion and the second portion are liquid lenses.

25. The method of claim 23 further comprising:
separating a first portion of the workpiece from a second portion of the workpiece along the contour;

wherein, the workpiece is an array of micro-electro-mechanical systems, and the first portion and the second portion are micro-electro-mechanical systems.

26. The method of claim 23 further comprising:
separating a first portion of the workpiece from a second portion of the workpiece along the contour;
wherein, the workpiece is an array of microfluidic devices, and the first portion and the second portion are microfluidic devices.

* * * * *